United States Patent
Takayama et al.

(10) Patent No.: US 8,472,273 B2
(45) Date of Patent: Jun. 25, 2013

(54) SEMICONDUCTOR DEVICE

(75) Inventors: Shinichi Takayama, Tokyo (JP); Akira Kotabe, Hino (JP); Kiyoo Itoh, Higashikurume (JP); Tomonori Sekiguchi, London (GB)

(73) Assignee: Elpida Memory, Inc., Tokyo (JP)

( * ) Notice: Subject to any disclaimer, the term of this patent is extended or adjusted under 35 U.S.C. 154(b) by 221 days.

(21) Appl. No.: 13/117,374

(22) Filed: May 27, 2011

(65) Prior Publication Data
US 2011/0292709 A1 Dec. 1, 2011

(30) Foreign Application Priority Data
May 28, 2010 (JP) ................................. 2010-123055

(51) Int. Cl.
*G11C 7/02* (2006.01)

(52) U.S. Cl.
USPC ....... 365/207; 365/205; 365/185.21; 365/196

(58) Field of Classification Search
USPC .............................. 365/185.21, 196, 205, 207
See application file for complete search history.

(56) References Cited

U.S. PATENT DOCUMENTS

| | | | |
|---|---|---|---|
| 4,551,641 A * | 11/1985 | Pelley, III | 327/55 |
| 7,768,813 B2 * | 8/2010 | Terzioglu et al. | 365/149 |
| 2008/0175084 A1 | 7/2008 | Akiyama et al. | |

FOREIGN PATENT DOCUMENTS

JP 2008-171476 A 7/2008

* cited by examiner

*Primary Examiner* — Anthan Tran
(74) *Attorney, Agent, or Firm* — Sughrue Mion, PLLC

(57) ABSTRACT

A semiconductor device includes a sense amplifier circuit. The sense amplifier circuit includes a cross-coupled first transistor and second transistor that perform amplification. The sources of the cross-coupled transistors are respectively connected in series with a third transistor and a fourth transistor, and electrical current supply capability of the third and fourth transistors is controlled by a control voltage given to control electrodes of the third and fourth transistors. In a data retaining period, a minimum sub-threshold current necessary for retaining the data is flowed to the third and fourth transistors according to the control voltage, and bit line potential is maintained.

20 Claims, 27 Drawing Sheets

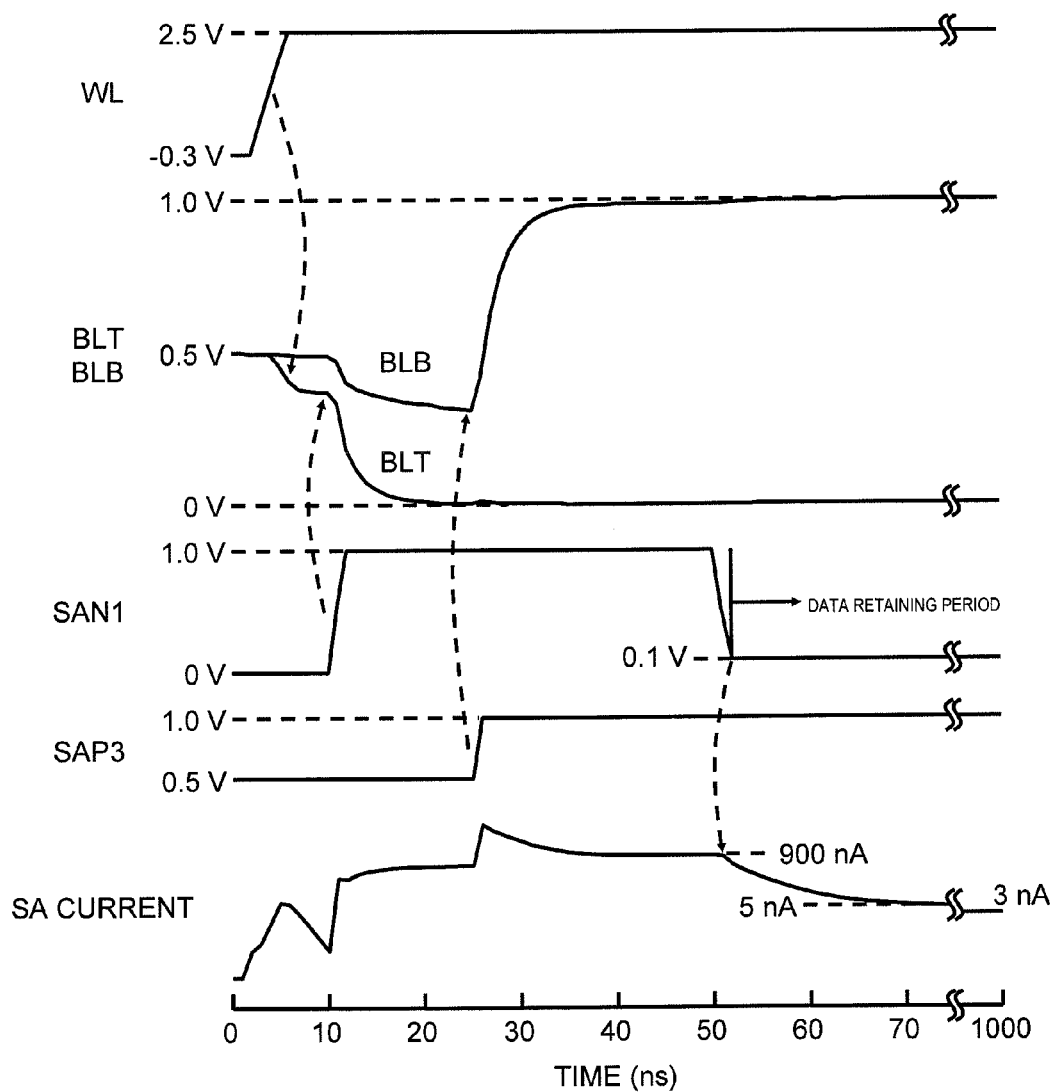

SEMICONDUCTOR DEVICE

REFERENCE TO RELATED APPLICATION

This application is based upon and claims the benefit of the priority of Japanese patent application No. 2010-123055 filed on May 28, 2010, the disclosure of which is incorporated herein in its entirety by reference thereto. The present invention relates to a semiconductor device. More specifically, the present invention relates to a sense amplifier circuit used in a semiconductor memory device.

TECHNICAL FIELD

Background

Since variation in threshold voltage VT of a MOS transistor increases along with miniaturization, operation speed of the MOS transistor on a chip varies increasingly. This variation in speed becomes more pronounced as operating voltage VDD thereof drops. The increase in the threshold voltage VT also causes an increase in offset voltage of a sense amplifier used in dynamic random access memory (referred to below as DRAM) and makes sensing operations unstable. Here, an offset voltage is the difference in threshold voltage VT of 2 cross-coupled MOS transistors that perform a signal amplification operation. Furthermore, since a sense amplifier operates at a low voltage of VDD/2 at an initial stage of an amplification operation, high speed operation becomes increasingly difficult as the threshold voltage VT variation increases. It is known that this offset voltage is reduced by decreasing impurities in a MOS transistor channel. Moreover, since the threshold voltage VT of the MOS transistor is reduced by decreasing the impurities, it is possible to operate the MOS at high speed, even with low voltage. As a result, a sense amplifier can also operate at high speed even with a low voltage. However, there is a problem in that, since a sub-threshold current increases when the threshold voltage VT is reduced, power increases when data is retained. In the present specification, a sub-threshold current and a leakage current are used with the same meaning.

Patent Document 1 describes an example of a sense amplifier SA that simultaneously realizes offset voltage reduction, high speed sensing operation, and low power data retention. The SA and a related circuit described in Patent Document 1 are shown in FIG. 27. The SA 116 is configured by an NMOS amplifier (NSA 119) formed from 4 NMOS transistors (Q1, Q2, Q3, and Q4), an NMOS latch (NL 118, a type of cross coupled amplifier) formed from 2 cross-coupled NMOS transistors (Q7 and Q8), and a PMOS amplifier (PSA 117) formed from 2 cross-coupled PMOS transistors (Q5 and Q6). With respect to the NSA 119, Q3 and Q4 are connected to respective drains of the cross-coupled Q1 and Q2. A feature of this SA 116 is that a threshold voltage VT of Q1 and Q2 is set to be smaller than other voltages. As mentioned above, since the offset voltage is small in an MOS with a small threshold voltage VT, by performing a sensing operation by the NSA 119, a stable and high speed sensing operation is possible even with low voltage. When data is retained, by the NSA 119 being inactive and the NL 118 retaining the data, reduction of data retention power is possible.

[Patent Document 1]
  JP Patent Kokai Publication No. JP-P2008-171476A, which corresponds to US Patent Application Publication No. US2008/0175084A1.

SUMMARY

The entire disclosure of Patent Document 1 is incorporated herein by reference thereto. The following analysis is given by the present invention.

There is a problem, however, in that with the sense amplifier SA 116 described in Patent Document 1, in comparison to an SA formed from the NL 118 and PSA 117 as have conventionally been used heretofore, the area of the overall sense amplifier increases by the area of the added NSA 119. Furthermore, since bit line length becomes longer by the added part, there are problems of an increase in bit line parasitic capacitance and a decrease in signal amount.

A semiconductor device according to a first aspect of the present invention includes: a plurality of memory cells; a bit line pair connected to plural related memory cells among the plurality of memory cells; and a sense amplifier circuit connected to the bit line pair. The sense amplifier includes: a first transistor having a control electrode connected to one of the bit line pair; a second transistor having a control electrode connected to another of the bit line pair; a third transistor connected in series with the first transistor; a fourth transistor connected in series with the second transistor; and a control circuit that supplies a control voltage to control electrodes of the third and fourth transistors. The control circuit, in a first period in which the sense amplifier circuit amplifies a potential difference between the bit line pair, controls the control voltage so that the third and fourth transistors have a first electrical current supply capability, and in a second period of maintaining the potential difference between the bit line pair, controls the control voltage so that the third and fourth transistors are conductive and have a second electrical current supply capability that is different from the first electrical current supply capability.

A semiconductor device according to a second aspect of the present invention includes: a plurality of memory cells; a bit line pair connected to plural related memory cells among the plurality of memory cells; and a sense amplifier circuit connected to the bit line pair. The sense amplifier includes: a first transistor having a control electrode connected to one of the bit line pair; a second transistor having a control electrode connected to another of the bit line pair; a third transistor connected in series with the first transistor; a fourth transistor connected in series with the second transistor; and a control circuit that supplies a control voltage to control electrodes of the third and fourth transistors. The control circuit controls the control voltage of the control circuit so that the sense amplifier circuit amplifies a potential difference between the bit line pair, in a first period, and in a second period of maintaining the amplified potential difference between the bit line pair, controls a sub-threshold current of the third and fourth transistors by the control voltage of the control circuit, so that the potential difference between the bit line pair is greater than or equal to a reproducible potential difference.

The meritorious effects of the present invention are summarized as follows. According to the present invention, an effect is obtained in that it is possible to provide a semiconductor device in which the sense amplifier area is decreased and operation is stable. A reason for this is that, in the second period, conventionally the NMOS latch (NL) has been used in maintaining a potential difference between the bit line pair, but in the present invention, by using the NMOS amplifier (NSA) configured from the first, second, third, and fourth transistors, in order to enable low leakage current data retention in the second period, since the control voltage of the third and fourth control electrodes is controlled, it is possible to do without the NMOS latch (NL), and the area of the sense amplifier can be reduced. Furthermore, by the area of the sense amplifier being reduced, it is possible to shorten the bit line length, bit line parasitic capacitance decreases, signal amount increases, and stable operation becomes possible.

BRIEF DESCRIPTIONS OF THE DRAWINGS

FIG. 3 is a simulation operation waveform diagram of the sense amplifier of FIG. 1.

PREFERRED MODES

Figure 1:
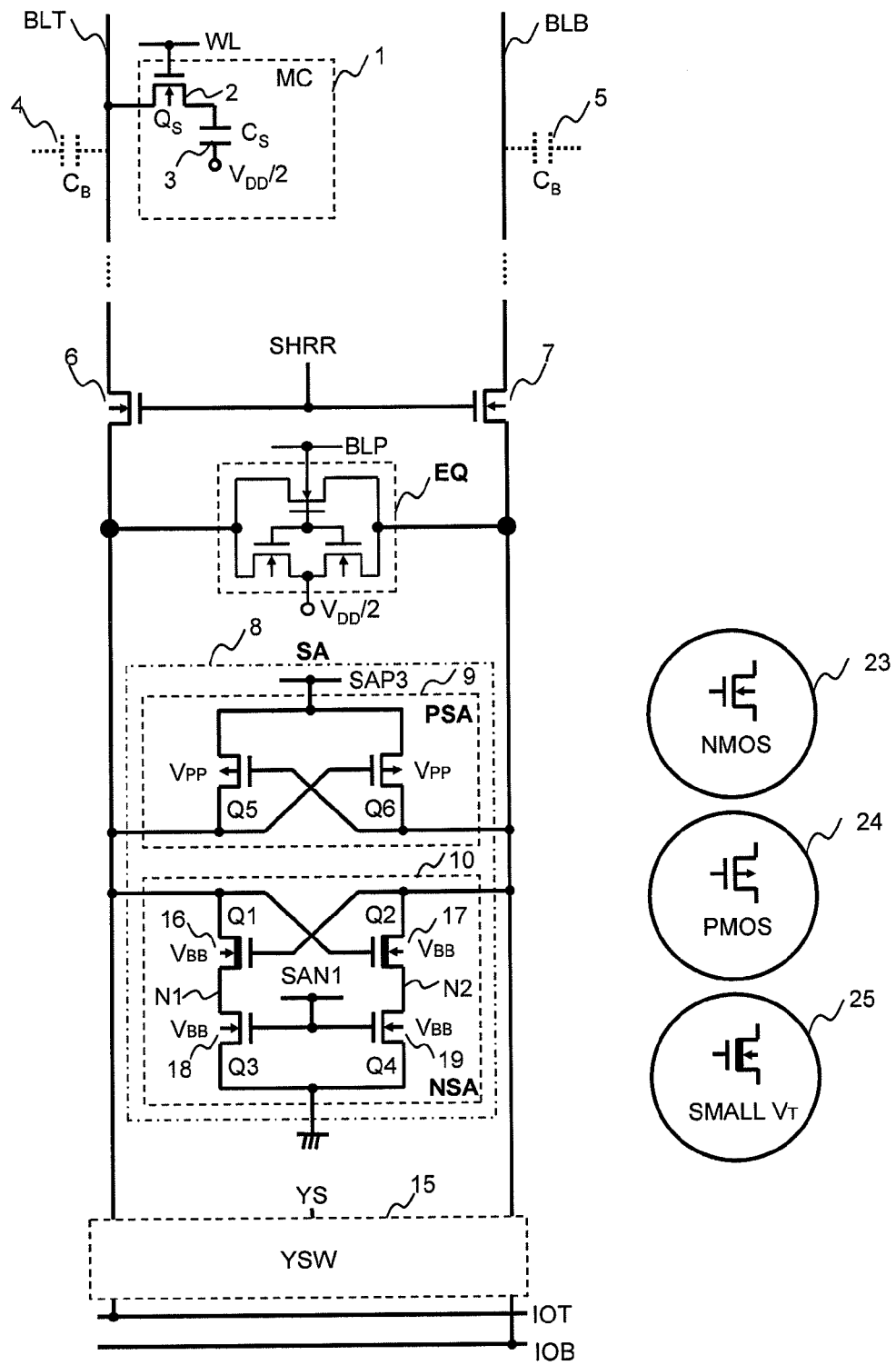
FIG. 1 is a diagram of a sense amplifier and related circuit of a first exemplary embodiment of the present invention.

A description will be given concerning modes of the present invention, making reference to the drawings as necessary. It is to be noted that with regard to the description of the modes, cited drawings and reference symbols in the drawings are shown as examples of the modes, and are not intended to limit variations of the modes of the present invention thereby. A description is given concerning modes of the present invention, making reference to the FIG. 1 and FIG. 2 as necessary.

Figure 2:
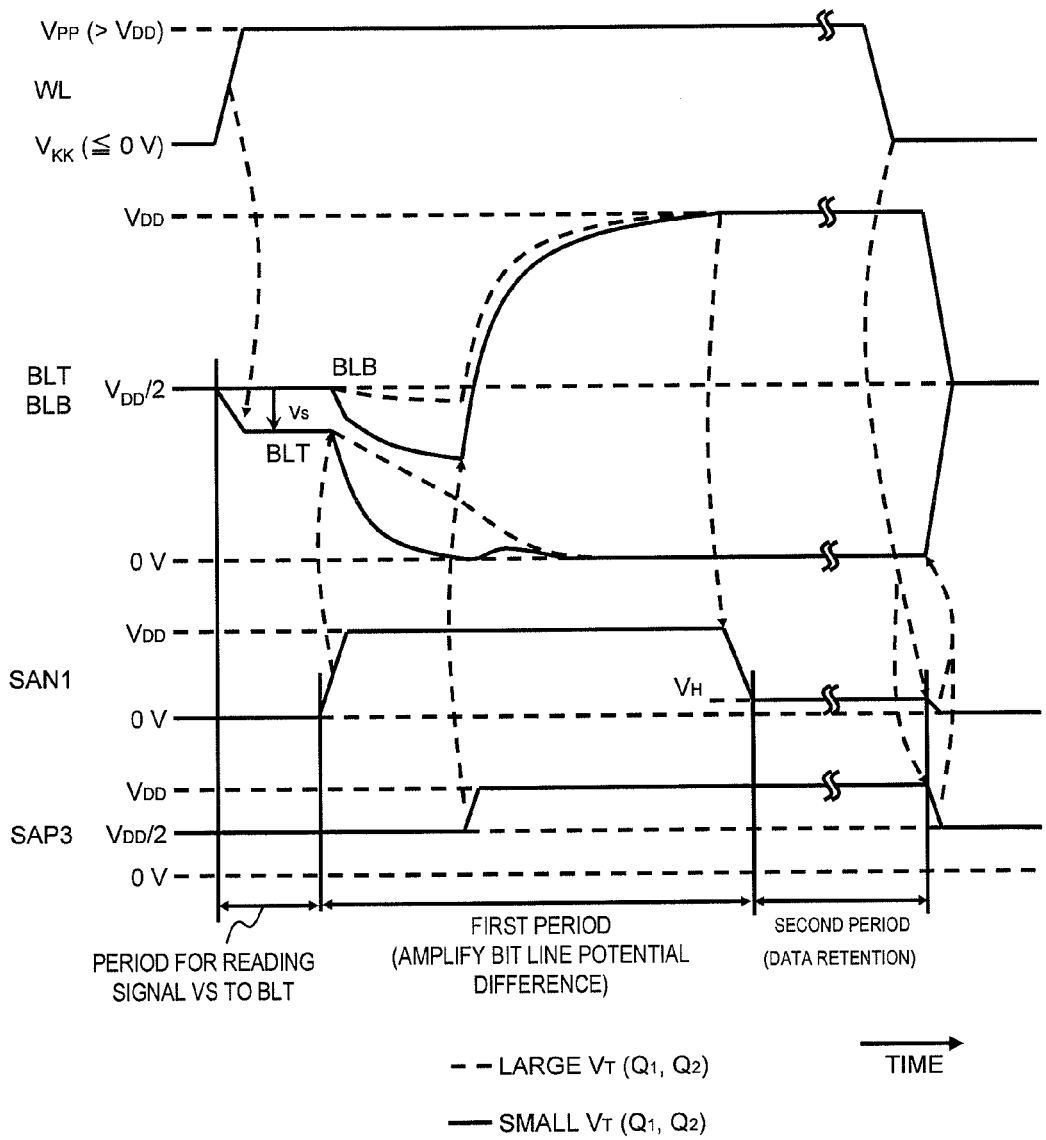
FIG. 2 is an operation timing diagram of the sense amplifier of FIG. 1.

According to a first aspect of the present invention, as shown in FIG. 1 and FIG. 2, a semiconductor device includes: a plurality of memory cells, a bit line pair BLT and BLB connected to a plurality of related memory cells MC, among the plurality of memory cells, a sense amplifier circuit SA 8 connected to the bit line pair, the sense amplifier SA 8 including: a first transistor 16 in which a control electrode is connected to one of the bit line pair BLB, a second transistor 17 in which a control electrode is connected to another of the bit line pair BLT, a third transistor 18 connected in series with the first transistor 16, a fourth transistor 19 connected in series with the second transistor 17, and a control circuit 33 (See FIG. 24) that supplies a control voltage to control electrodes of the third and fourth transistors 18 and 19; wherein the control circuit 33, in a first period in which the sense amplifier circuit SA 8 amplifies a potential difference between the bit line pair BLT and BLB, controls a control voltage SAN1 so that the third and fourth transistors 18 and 19 have a first electrical current supply capability, and in a second period of maintaining a potential difference between the bit line pair, controls the control voltage SAN1 so that the third and fourth transistors 18 and 19 are conductive and have a second electrical current supply capability that is different from the first electrical current supply capability.

In the semiconductor device according to the first aspect of the present invention, amplification is performed in the first period by an NMOS amplifier NSA 10 formed from the first, second, third, and fourth transistors in FIG. 1. At a time of amplification, the third transistor 18 and the fourth transistor 19 must be ON, and the control voltage SAN1 supplied to gates of the third and fourth transistors by the control circuit 33 is VDD. Thereafter, in the second period, the control voltage SAN1 is dropped to VH, in order to curb a leakage current. That is, by making the second electrical current supply capability lower than the first electrical current supply capability, the leakage current is curbed. In this regard, the reduction in level goes as far as a level at which data retention is possible. Furthermore, conventional technology has used an NMOS latch (NL 118) in order to retain data, but in the present mode, since this can be replaced using an NMOS amplifier NSA 10, a configuration is possible without the NMOS latch (NL 118), and the sense amplifier SA 8 can have a small area.

According to a second aspect of the present invention, as shown in FIG. 1 and FIG. 2, a semiconductor device includes: a plurality of memory cells, a bit line pair BLT and BLB connected to a plurality of related memory cells MC, among the plurality of memory cells, and a sense amplifier circuit SA 8 connected to the bit line pair, the sense amplifier SA 8 including: a first transistor 16 in which a control electrode is connected to one of the bit line pair BLB, a second transistor 17 in which a control electrode is connected to another of the bit line pair BLT, a third transistor 18 connected in series with the first transistor 16, a fourth transistor 19 connected in series with the second transistor 17, and a control circuit 33 that supplies a control voltage to control electrodes of the third and fourth transistors 18 and 19; wherein the control circuit 33, in a first period, controls a control voltage SAN1 so that the sense amplifier circuit amplifies a potential difference between the bit line pair BLT and BLB, and in a second period of maintaining a potential difference between the amplified bit line pair, controls a sub-threshold current of the third and fourth transistors 18 and 19, by a control voltage VH of the control circuit 33 so that the potential difference of the bit line pair becomes greater than or equal to a reproducible potential difference.

In the semiconductor device according to the second aspect of the present invention, amplification is performed in a first period by the NMOS amplifier NSA 10 including the first, second, third, and fourth transistors in FIG. 1. Thereafter, in the second period, if the NMOS amplifier NSA 10 is made inactive, the potential of the bit line that went to a low potential in the first period rises from 0V, there is no longer a potential difference between the bit lines, and the data cannot be retained. Thus, in the present invention, in the second period, the control voltage VH of the control circuit 33 is appropriately controlled, a sub threshold current of the third and fourth transistors 18 and 19 is made to flow to some extent, and the potential difference between the bit line pair maintains at least a potential difference that can be reproduced. Potential between bit lines that has decayed can be reproduced by returning the control voltage of the control circuit 33 from VH to VDD, until read to common I/O lines, for example. In this way, in the present mode, by using the NMOS amplifier NSA 10, since it becomes possible to curb the leakage current in the second period and also to maintain the potential difference between the bit lines, a configuration without the NMOS latch NL 118 is possible, and the area of the sense amplifier SA 8 can be reduced.

A detailed description of exemplary embodiments is given below, making reference to the drawings.

First Exemplary Embodiment

Configuration of First Exemplary Embodiment

Figure 24:
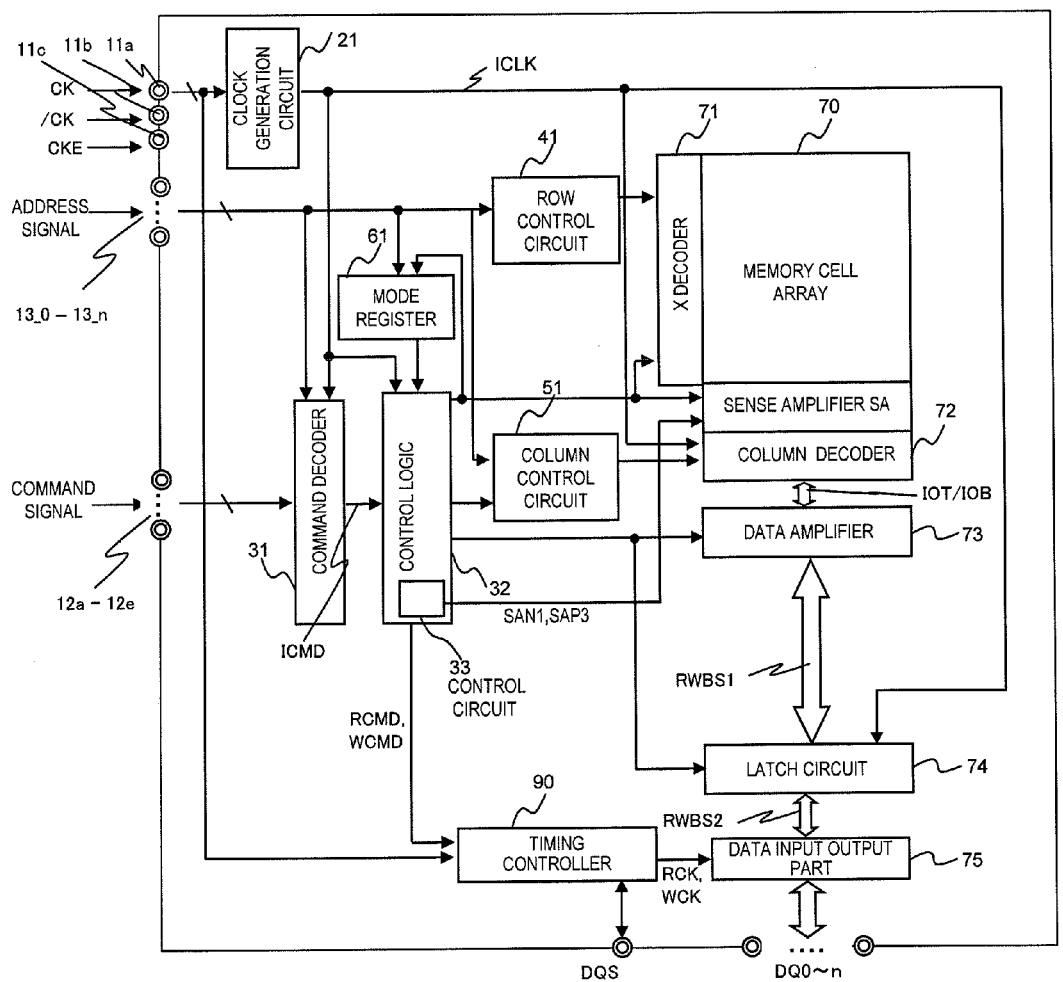
FIG. 24 is a block diagram of an overall DRAM of the present invention.

FIG. 24 is a block diagram representing an overall DRAM. First, referring to FIG. 24, a configuration of the overall DRAM is described. Clock pads 11a and 11b are pads respectively supplied with external clock signals CK and /CK, and a clock enable pad 11c is a pad that receives a clock enable signal CKE. The supplied external clock signals CK and /CK, and the clock enable signal CKE are supplied to a clock generation circuit 21. In the present specification, a signal having a symbol "/" in front of the signal name indicates that the signal in question is an inverse signal or a low active signal. Thus, the external clock signals CK and /CK are mutually complementary signals. The clock generation circuit 21 is a circuit that generates an internal clock signal ICLK, and the generated internal clock signal ICLK is supplied to a wide variety of circuit blocks in a semiconductor chip.

Command pads 12a to 12e are pads each supplied with a row address strobe signal /RAS, a column address strobe /CAS, a write enable signal /WE, a chip select signal /CS, and an on-die termination signal ODT. These command signals are supplied to a command decoder 31.

Address pads 13_0 to 13_n are pads supplied with address signals ADD, and the supplied address signals ADD are supplied via an address input circuit (not illustrated in the drawings) to a row control circuit 41, a column control circuit 51, a command decoder 31, and a mode register 61. More specifically, in normal operation mode, a row address is supplied to the row control circuit 41, and a column address is supplied to the column control circuit 51. Furthermore, in a case of an entry to a mode register set, an address signal ADD is supplied to the mode register 61, and in this way, content of the mode register is updated.

The command decoder 31 is a circuit that generates various types of internal commands ICMD, by synchronizing with the internal clock ICLK, and retaining, decoding and counting a part of the command signals and address signals. The generated internal commands ICMD are supplied via control logic 32 to various types of circuit block in the semiconductor chip.

The control logic 32 responds to an internal command ICMD supplied from the command decoder 31 and output of the mode register 61, and is synchronized with the internal clock signal ICLK to control operation of various types of circuit block. A control circuit 33 that generates a control voltage SAN1 and a control voltage SAP3 is disposed in the control logic 32.

Output of the row control circuit 41 is supplied to an X decoder 71. The X decoder 71 is a circuit that selects any word line WL included in a memory cell array 70. Within the memory cell array 70, a plurality of word lines WL and a plurality of bit lines BL intersect and memory cells MC are arrayed at these intersection points. The bit lines BL are connected to corresponding sense amplifiers SA.

Output of the column control circuit 51 is supplied to a column decoder 72. The column decoder 72 is a circuit that selects any sense amplifier SA of a plurality of sense amplifiers SA. The sense amplifier SA selected by the column decoder 72 is connected via an I/O line IO to a data amplifier 73. The data amplifier 73 further amplifies read data RD amplified by the sense amplifier SA when a read operation is performed, and supplies this to a latch circuit 74 via a read-write bus RWBS1. On the other hand, when a write operation is performed, write data WD supplied from the latch circuit 74 via the read-write bus RWBS1 is amplified, and this is supplied to the memory cell array 70.

The latch circuit 74 is a parallel-serial conversion circuit that performs parallel-serial conversion of input and output data between the data amplifier 73 and a data input output part 75, and when a read operation is performed, read data RD supplied from the data amplifier 73 is supplied to the data input output part 75 via a read-write bus RWBS2. On the other hand, when a write operation is performed, data inputted via the read-write bus RWBS2 from the data input output part 75 is supplied to the data amplifier.

A timing controller 90 includes a DLL (Delay Locked Loop) circuit that controls input and output timing of data, and when a read operation is performed, a read timing signal RCK that controls read timing of data with respect to the data input output part 75 is outputted, in response to a read command RCMD supplied by the control logic 32, and the external clock signals CK and /CK, and at the same time a data strobe signal DQS is outputted to the outside, via a data strobe pad. On the other hand, when a write operation is performed, a write timing signal WCK that controls uptake timing of write data with respect to the data input output part 75 is supplied to the data input-output part, in response to a write command WCMD supplied by the control logic 32, the external clock signals CK and /CK, and a data strobe signal DQS supplied via the data strobe pad.

Figure 25:
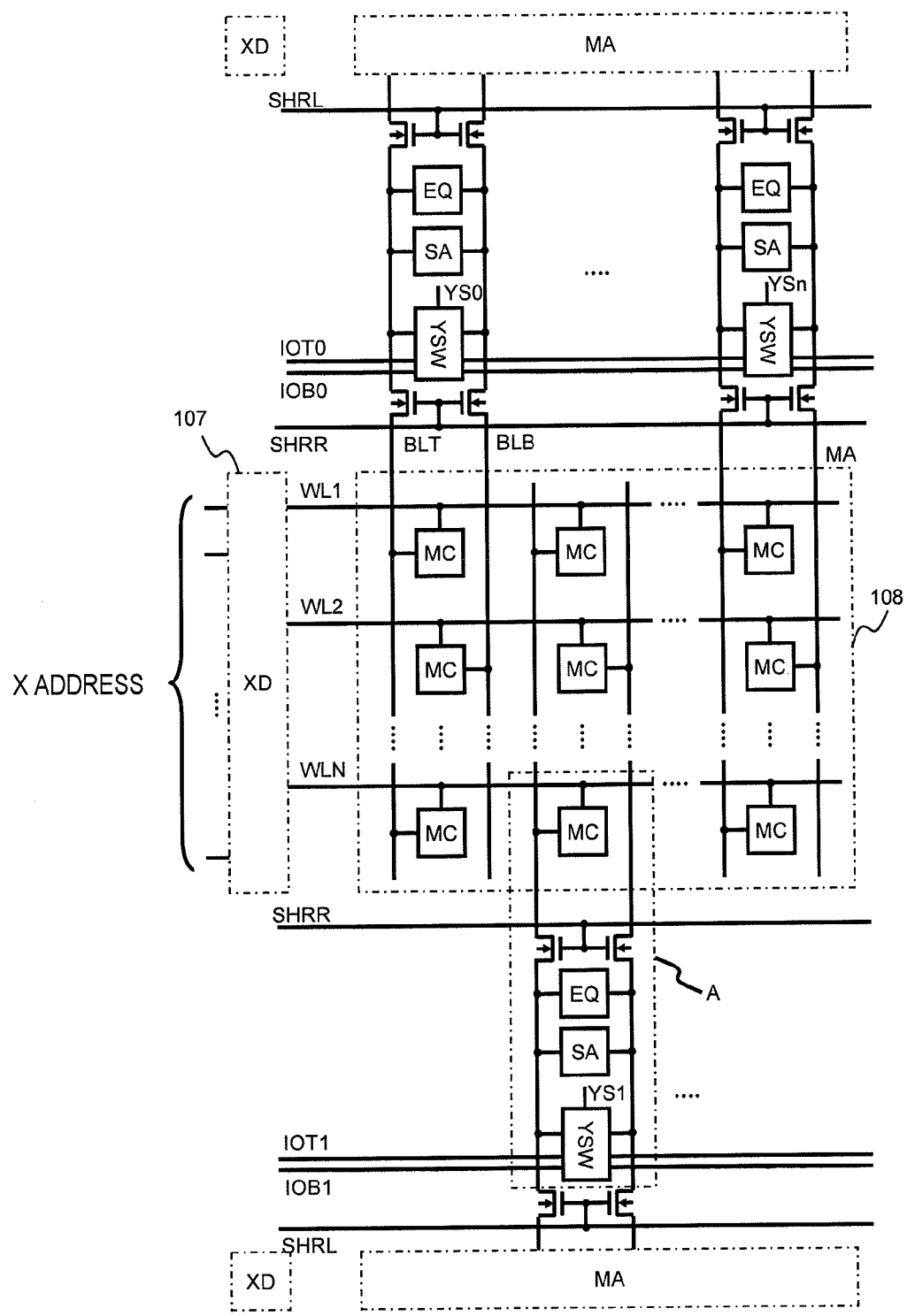
FIG. 25 is a block diagram of a memory array and related circuit of the present invention.

Next, FIG. 25 is a block diagram describing in more detail the memory cell array 70, the sense amplifier SA, and the X decoder 71 portions of FIG. 24. Here, the memory cell array uses a folded bit line system. The sense amplifier SA is selected by a Y decoder, which is not illustrated. A similar configuration is possible with what is called an open bit line system.

Next, FIG. 1 is a circuit diagram of portion A of FIG. 25, where a bit line pair portion in the memory cell array of FIG. 25 is cut out.

The sense amplifier SA 8 of the semiconductor device of the present invention is distinguished by having MOS transistors Q3 and Q4, which have a sufficiently large threshold voltage VT, connected in series with respective sources of 2 cross-coupled MOS transistors Q1 and Q2 that are for amplification. A plurality of the memory cells MC is connected to the bit line pair BLT and BLB, and each memory cell is configured from a memory cell capacitor Cs that stores information and a selection transistor Qs. The memory cell MC of FIG. 1 illustrates one among this plurality of memory cells. One Cs electrode end is fixed at a voltage VDD/2, and at the other, 0V or binary information corresponding to VDD is stored.

Furthermore, a bit line capacitor CB is present in each of the bit lines BLT and BLB. Since a signal voltage obtained by reading the memory cell capacitor Cs is weakened, it is required to make the bit line as short as possible, and not weaken the read signal voltage.

In addition, a pre-charge circuit EQ for pre-charging the bit line pair BLT and BLB to a potential of VDD/2 before the read operation is connected to the bit line pair. The pre-charge circuit performs ON/OFF control by a control signal BLP.

Here, pre-charging the bit lines to a level of VDD/2, or what is called a VDD/2 bit line pre-charge system is assumed, and this system has advantages such as low power, low noise, and no necessity for a special reference circuit for distinguishing small signals. Furthermore VPP is a boosted word line voltage necessary for full write and full read, that is, a boosted voltage necessary for adequately obtaining a signal for writing VDD in a memory cell MC or reading from a memory cell, without being affected by the threshold voltage VT of the selection transistor Qs in the memory cell MC. VPP is used as a substrate voltage of a PMOS transistor. VBB is a substrate voltage of an NMOS transistor.

Control signals SHRR and SHRL in FIG. 25 are control signals for controlling electrical connection and disconnection between the sense amplifier SA 8 and the memory cell MC. With regard to the control signal SHRR in FIG. 1, when the SHRR signal is High, the memory cell MC and the sense amplifier SA are electrically connected. On the other hand, when it is desired not to select the memory cell MC, the SHRR signal may be made Low and not connected with the sense amplifier SA.

The sense amplifier SA 8 is connected to the bit lines BLT and BLB, as in FIG. 1. Here, the sense amplifier SA 8 is configured from an NMOS amplifier (referred to below as NSA) 10, and a PMOS amplifier (referred to below as PSA) 9. A control circuit 33 that generates a control voltage SAN1 and a control voltage SAP3 is disposed in the control logic 32 of FIG. 24, and outputs a control voltage as shown in FIG. 2.

The NSA 10 is configured from the 2 NMOS transistors Q1 and Q2 that have a small threshold voltage VT, and the 2 NMOS transistors Q3 and Q4 that have a large threshold voltage VT. VBB is supplied as a substrate voltage of the NMOS transistors Q1, Q2, Q3, and Q4. Here, a gate of Q2 is connected to the bit line BLT, and a gate of Q1 is connected to a bit line BLB. In addition, Q3 is connected in series with Q1, and Q4 is connected in series with Q2. In more detail, a drain of Q3 is connected to a source of Q1, and a drain of Q4 is connected to a source of Q2. Furthermore, a drain of Q1 and a gate of Q2 are connected, a drain of Q2 and a gate of Q1 are connected, and Q1 and Q2 are cross-coupled as in FIG. 1. Sources of Q3 and Q4 are commonly connected to ground potential. At gates of Q3 and Q4, electrical current supply capability of Q3 and Q4 is controlled by a control voltage SAN1 supplied form the control circuit part.

Next, a PSA 9 in the SA 8 is configured from 2 PMOS transistors Q5 and Q6. The PSA 9 is the same as a PSA in a sense amplifier of conventional technology shown in FIG. 27. A gate of Q6 is connected to the bit line BLT, and a gate of Q5 is connected to the bit line BLB. Furthermore, a drain of Q5 and a gate of Q6 are connected, a drain of Q6 and a gate of Q5 are connected, and Q5 and Q6 are cross-coupled as in FIG. 1. At sources of Q5 and Q6, conductivity or non-conductivity of Q5 and Q6 is controlled by the control voltage SAP3 supplied from the control circuit 33.

Furthermore, a Y selection switch circuit (referred to below as YSW) 15 is a circuit for reading a potential difference of the bit line pair BLT and BLB to common I/O lines (IOT and JOB). If a Y selection line YS is selected by an address signal, it is possible to extract an amplified potential difference of the bit line pair, to the common I/O lines (IOT and JOB). In addition, when writing, conversely, a potential is given to the common I/O lines (IOT and JOB), and writing is performed with regard to the potential of the bit line pair, through the YSW.

Figure 23:
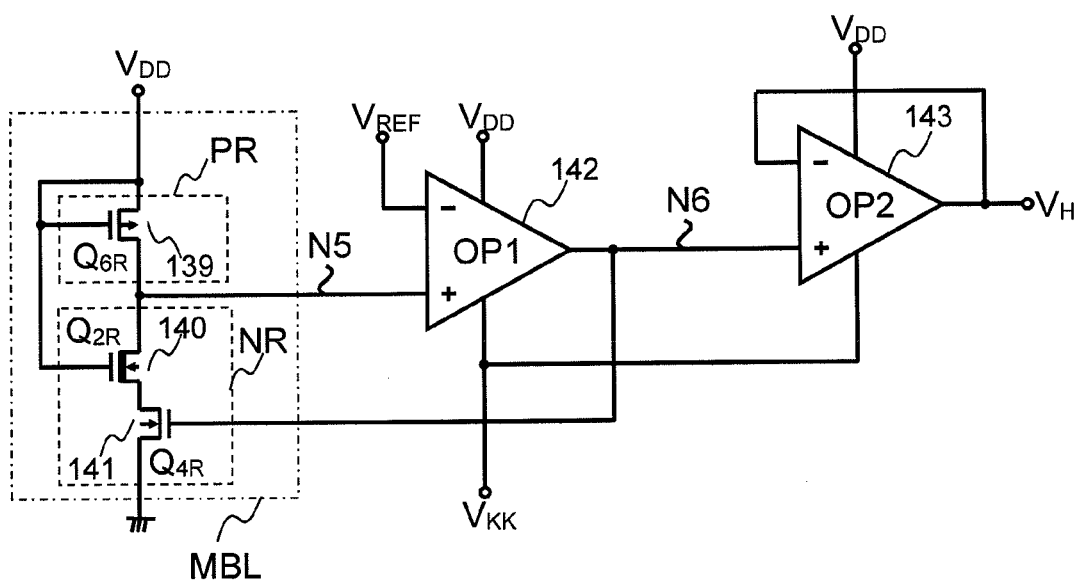
FIG. 23 is a circuit diagram of an intermediate potential generation circuit of the present invention.

Next, in the control voltage SAN1 outputted by the control circuit 33, the VH voltage set in a data retaining period is a voltage for controlling the electrical current supply capability of Q3 and Q4, and generation of high precision voltage is required. FIG. 23 shows an intermediate potential generation circuit that generates the VH voltage. The circuit is disposed in the control logic 32 of FIG. 24, and supplies the voltage VH to the control circuit 33.

A description is given below concerning a configuration of the circuit of FIG. 23. FIG. 23 is an intermediate potential generation circuit that is configured from a bit line voltage monitoring circuit MBL and 2 operational amplifiers OP1 and OP2. The MBL is a circuit for monitoring a monitor voltage related to one voltage of the bit line pair BLT and BLB, and is configured by a MOS transistor the same as a sense amplifier. The MBL of FIG. 23 is a circuit configuration that simulates the sense amplifier SA 8 of FIG. 1 in a data retaining period, and with a bit line voltage on a low potential side as a monitor voltage, is arranged to be able to monitor this monitor voltage. The MBL is configured from a replica circuit (below, PR) of the PMOS amplifier PSA 9, and a replica circuit (below, NR) of the NMOS amplifier NSA 10. The PR is configured by Q6R, which is a transistor having a characteristic the same as the MOS transistor Q6 in the PMOS amplifier PSA 9, with a gate and source thereof being connected to VDD, and a drain being connected to a node N5. The NR is configured using transistors Q2R and Q4R having characteristics respectively the same as the 2 MOS transistors Q2 and Q4 in the NMOS amplifier NSA 10. A drain of Q2R is connected to the node N5, a gate is connected to VDD, and a source is connected to a drain of Q4R. A gate of Q4R is connected to a node N6, and a source is connected to VSS.

Operation of First Exemplary Embodiment

Next, a description is given concerning operation of the first exemplary embodiment, making reference to FIG. 1 and FIG. 2, as appropriate.

FIG. 2 is an operation timing diagram of the sense amplifier of FIG. 1. Operation time can be divided into 3 periods, according to operation content. As shown in FIG. 2, an initial period is a period for reading a signal Vs to the bit line BLT; subsequently, there is a period for amplifying a bit line potential difference; and finally there is a period for retaining data. Here, the period for amplifying the bit line potential difference is called a first period, and the period for retaining data is called a second period.

As in conventional cases, the bit line pair BLT and BLB is pre-charged by a pre-charge circuit EQ to VDD/2, which is half the maximum voltage VDD of the bit lines.

Next, a description is given concerning operation in the period for reading the signal Vs, which is the initial period in FIG. 2, to the bit line BLT. A pulse voltage VPP of at least VDD is applied to a word line WL, and one of small positive and negative signals with VDD/2 as center in response to storage information from the memory cell MC are outputted on BLT. For example, a case may be considered in which a read signal Vs on a negative side is superimposed on a floating voltage VDD/2, on a bit line BLT. Here, the read signal Vs is given by Equation (1).

$$Vs = CsVDD/\{2(Cs+CB)\} \quad \text{Equation (1)}$$

Here, CB is bit line capacitance, and Cs is memory cell capacitance. As may be understood from Equation (1), with smaller bit line capacitance CB, the read signal Vs has a large value, operation is stable, and an operation of amplification thereafter is at high speed, so that it is required that the bit line capacitance CB be small.

Next, a description is given concerning operation in the first period of FIG. 2. First, in a case where the control voltage SAN1 supplied to the gates of Q3 and Q4 of FIG. 1 is sufficiently high, conditions for amplifying a signal correctly are considered. First, a start is made by turning Q1 ON, to be higher than gate voltage, by a cross-coupled pair of MOS transistors that are configured from cross-coupled Q1 and Q2. That is, since the condition VGS(Q1)>VT(Q1) applies, Q1 is ON and the NSA starts amplification. In FIG. 2, in Q1 and Q2, in a case of using MOS transistors with low threshold voltage VT, bit line potentials BLT and BLB are shown with a full line, and in Q1 and Q2, in a case of using MOS transistors with high threshold voltage VT, bit line potentials BLT and BLB are shown with a broken line. As may be understood from FIG. 2, amplification operations are performed at high speed in Q1 and Q2 when they have a low threshold voltage VT. In addition, with the threshold voltage VT of Q1, namely VT(Q1), lower, operations are performed even when the VDD voltage is low. Furthermore, since the threshold voltage VT is low, it is possible to reduce variation of the threshold voltage VT. Accordingly, there is an advantage in that it is possible to reduce offset voltage, which is the difference in the threshold voltage VT of Q1 and Q2, and to perform stable operation. For this reason, in the first exemplary embodiment, MOS transistors with low threshold voltage VT are used in Q1 and Q2. In conventional technology as in FIG. 27, for the same reason, MOS transistors with low threshold voltage VT are used in Q1 and Q2. Here, in a case of using the MOS transistors with low threshold voltage VT in Q1 and Q2, the potential of the high level bit line BLB is lowered by the amount by which the threshold voltage VT is smaller. However, as described below, with regard to this lowered amount, if the PSA 9 is turned ON, the lowered bit line voltage is restored to VDD.

It is to be noted that until the control voltage SAN1 supplied to the gates of Q3 and Q4 goes to VDD, that is, until the first period is entered, since the NSA 10 is in an inactive state, even if the threshold voltage VT of Q1 and Q2, which are MOS transistors for amplification, is low, leakage current at an inactive time does not increase.

Here, in a case where the threshold voltage VT of Q1 and Q2 is reduced, it is preferable to separate the sources of Q1 and Q2, and to independently add Q3 and Q4 to the respective sources. The reason for this is that, in a case where the sources of Q1 and Q2 are directly connected and the threshold voltage VT of Q1 and Q2 is reduced, due to leakage current thereof, there is a tendency for bit lines BLT and BLB to interfere, through the respective sources, and for conduction differential signal component Vs to weaken.

Internal power supply voltages VBB, VDD/2 (See FIG. 1), VKK (See FIG. 2), VH, and VREF (See FIG. 23) used in the first exemplary embodiment are normally generated internally in a chip, based on VDD, but these internal voltages do not affect power consumption of the chip to the extent of VDD. With regard to a DRAM, since multiple bit line pairs are driven at the same time at VDD amplitude, reducing charge/discharge power of the bit lines, that is reducing VDD, is important in reducing the power consumption of the chip. Therefore, in the first exemplary embodiment, by using the MOS transistors with low threshold voltage VT in Q1 and Q2, which perform amplification operations, it becomes possible to operate even when VDD is a low voltage, and lower power consumption is realized.

Next, a prescribed time after the start of the first period, by the control voltage SAP3 of the control circuit 33, supplied to the sources of Q5 and Q6 of the PSA 9, going from VDD/2 to VDD, as shown in FIG. 2, Q5 and Q6 go from a non-conductive state to a conductive state. A latch operation with regard to the bit line pair is performed by the PSA 9 and NSA 10, which are in a conductive state; the potential of the bit line BLB that is on a high potential side is VDD, and the potential of the bit line BLT that is on a low potential side is 0. In SA 116 of the conventional technology of FIG. 27, the latch operation has been performed by a PSA 117 and NL 118. Meanwhile, in the first exemplary embodiment, a function of the NL 118 of the conventional technology is replaced by the NSA 10. In this way, in the first exemplary embodiment, even without the NMOS latch circuit NL 118 of the conventional technology, it is possible to perform a latch operation, and a sense amplifier with a smaller area is realized.

Next, a description is given concerning operation in the second period. Data must be retained until read by the common I/O lines, according to potential difference of the amplified bit line pair. Meanwhile, in the second period in which data is retained, it is required to reduce the leakage current as much as possible, in order to reduce power consumption. In the conventional technology circuit of FIG. 27, by controlling the NSA 119 to an inactive state, during a data retaining period, the leakage current is reduced.

In the first exemplary embodiment of FIG. 1, in the second period when SAN1 is VDD, a leakage current continues to flow via Q6, with SAP3, in Q2. This is because the threshold voltage VT of Q2 is small. On the other hand, since the bit line BLB is VDD, Q1 and Q3 are conductive, but since the bit line BLT is 0V, a current does not flow in Q1 and Q3. In a case where pulse width of a word line voltage is sufficiently short, a period in which this leakage current flows is short and the effective leakage current is small, so that there is no problem. However, when this is long, that is, in a case where data amplified on the bit line is retained for a long time, the leakage current may be a problem. This is because this type of leakage current continues to flow at the same time in the amplifier NSA 10 of each of multiple bit line pairs on the same word line. In general, the lower a gate-source voltage therebetween is, the larger the threshold voltage VT is, or the smaller the channel width thereof is, the more the leakage current of a MOS transistor decreases. Therefore, by adding Q4, and controlling these parameters of Q4, it is possible to curb the leakage current of Q2 to approximately a leakage current that is necessary for retaining the data. For this reason, it is necessary to change the gate voltage of Q4 to a low voltage VH.

Since the source of Q4 has a fixed voltage of 0V, Q4 is a constant current source from a leakage current determined by the gate voltage, threshold voltage VT, and channel width thereof. In order that this leakage current and the leakage current of Q2 are equal, the potential of node N2, which is the source of Q2, is raised by δ. Since a reverse bias of δ is added between gate and source and between substrate and source of Q2, the leakage current of Q2 decreases to become equal to that of Q4. Therefore, the lower VH is, and the larger the threshold voltage VT of Q4 is compared to the threshold voltage VT of Q2, or the smaller the channel width of Q4 is compared to that of Q2, the smaller the leakage current of Q2 becomes. In this way, if 2 MOS transistors are connected vertically, it is possible to reduce the leakage current. This reduction effect is called the stacking effect.

According to the abovementioned stacking effect, configuring a transistor with little leakage current on a ground side enables reduction of overall leakage current. Therefore, the NSA 10 of the first exemplary embodiment has a transistor configuration that enables a reduction in the leakage current, in comparison with the NSA 119 of conventional technology as in FIG. 27.

In the first period, which is a period in which bit potential difference is amplified, Q3 and Q4 are in a conductive state, and in the second period, which is a period in which data is retained, Q3 and Q4 are not in a non-conductive state, with respect to a sub-threshold current flowing. For this reason, a state in which the sub-threshold current is flowing in the second period is referred to as being conductive in the present specification. Furthermore, the electrical current supply capability of Q3 and Q4 in the first period is referred to as a first electrical current supply capability, and the electrical current supply capability of Q3 and Q4 in the second period is referred to as a second electrical current supply capability. In the first exemplary embodiment, the second electrical current supply capability is lower than the first electrical current supply capability.

In the first exemplary embodiment of FIG. 1, by the sub-threshold current flowing in Q3, a rise in the potential of the bit line BLT on the low potential side is prevented. Since the leakage current is curbed in the second period, if VH is made low, from a certain place the potential of the bit line BLT on the low potential side rises. The amount of increase in this potential, according to a relationship of the electrical current supply capability of current flowing in Q5 and the electrical current supply capability of current flowing in Q3, settles at a state that is in balance. Therefore, by appropriately controlling the electrical current supply capability of current flowing in Q3, it is possible to hold the potential difference of the bit line pair at or above a certain potential difference. Although the potential difference between the bit lines narrows, by giving a pulse to the control voltage SAN1, immediately before reading to the common I/O lines, it is possible to reproduce the potential difference between the bit lines. That is, with regard to the potential between the bit line pair in the second period, it is sufficient if a potential difference that can be reproduced is retained.

In the example of FIG. 2, VDD is added to SAN1, but it is also possible to have two stage amplification in which initially a comparatively low voltage, for example, VH, the same as in the data retaining period, is added, and thereafter VDD is added. This type of two stage amplification is effective in a case where there is an imbalance in capacitance between bit lines. For example, in the above described VDD/2 bit line pre-charge system, there is an imbalance of memory cell capacitance Cs, and this type of imbalance has an effect as noise at the beginning of amplification. However, if VH is lowered and the bit lines gradually discharged, and VDD applied after a certain amount of amplification, it is possible to perform amplification at high speed with low noise. It is possible to reduce signal voltage by an amount by which the noise is reduced, and as a result, since Cs can be reduced, a low cost DRAM is realized. Furthermore, since lowering of the bit line voltage BLB is curbed, it is possible to reduce operating current.

As described above, in addition to an advantage in that, since VT is small, VT variation of the cross-coupled MOS transistors Q1 and Q2 of the NMOS amplifier NSA is decreased, the effect of VT variation becomes even smaller, since Q3 and Q4 are connected, for the following reason. That is, voltages at a time of pre-charging node N1 (source of Q1) and node N2 (source of Q2) are respectively VDD/2-VT(Q1) and VDD/2-VT(Q2). Therefore, when Q3 and Q4 are ON, even with a difference in VT between Q1 and Q2, VTs of the cross-coupled MOS transistors Q1 and Q2 cancel out, so that operation starts at the same time. Conventionally, since the source voltage of the cross-coupled MOS transistors was constant, the VT difference of Q1 and Q2 was the difference in operation timing, and effectively, noise was generated.

FIG. 3 is a simulation operation waveform diagram at a time of amplification, and is an example where VDD=1V. Here, MOS transistor device dimensions are: W/L(Q1, Q2)=1.79 μm/0.17 μm, W/L(Q3, Q4)=0.46 μm/0.13 μm, W/L (Q5, Q6)=0.52 μm/0.14 μm; and VPP=2.5V, VKK=VBB=−0.3V, VT(Q1, Q2)=0.16V, VT(Q3, Q4)=0.46V, VT(Q5, Q6)=−0.58V, CB=73 fF, and CS=25 fF. Here, VT is a value where approximately 0.3V is added to VT normally defined by a constant current (nA/μm), using what is called an extrapolated value.

Figure 4A:
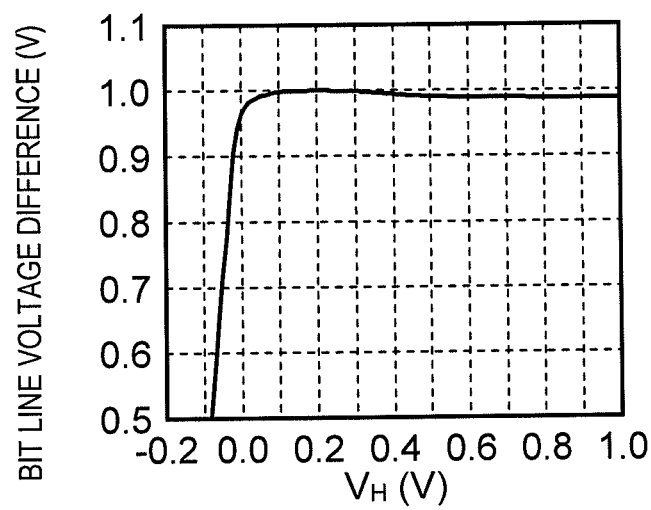
FIG. 4A is a diagram showing a relationship between bit line voltage difference and VH for the sense amplifier of FIG. 1.
Figure 4B:
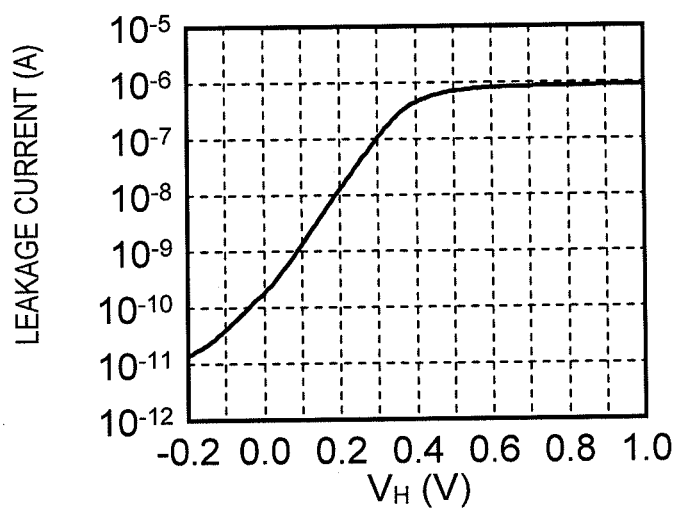
FIG. 4B is a diagram showing a relationship between leakage current and VH, when retaining data.

In addition, with regard to FIG. 4, FIG. 4A shows bit line voltage difference where the SAN1 voltage drops from 1.0 V to VH, in a data retaining period after amplification has been completed, and FIG. 4B shows leakage current at a time of data retention. Operating conditions are the same as in FIG. 3. From FIGS. 4A and 4B, for example, if VH is dropped to 0.1V, it is understood that compared to a large VH of approximately 0.4V or larger, it is possible to reduce the leakage current by 2 orders of magnitude or more, while maintaining a bit line voltage difference of 1V. Furthermore, with unnecessary VH power supply voltage of VH=0V, the leakage current reduction effect becomes even more pronounced. Here, when VH drops to 0V or less, the bit line voltage difference starts to rapidly decrease; this is because the bit line BLT that is suppressed to a 0V side, rises towards a VDD side. As described above, this is due to current drive capability of Q3 and Q4 of the NSA decreasing. In this type of area, if the bit line voltage difference goes approximately as far as 0.1V, with a high accuracy VH generation circuit, stable DRAM operation is possible. The bit line voltage difference of 0.1V is outside the graph shown in FIG. 4A, and corresponds to approximately VH=−0.1V. In this way even with a small bit line voltage difference, when SAN1 is returned to VDD, retained information correctly returns to VDD=1V. As described above, this is because if offset voltage of the NSA is 0.1V or less, it is sufficiently small.

As may be understood from FIG. 4A and FIG. 4B, a characteristic of a leakage current or the like is that of being very sensitive to VH, so that an intermediate potential generation circuit, which generates high accuracy VH voltage, is necessary. A description is given below concerning operation of the intermediate potential generation circuit of FIG. 23. The circuit of FIG. 23 is a circuit that outputs a VH voltage so that a monitor voltage associated with a bit line voltage on a low potential side is a desired voltage VREF. OP1 controls MBL so that a node N5, corresponding to a bit line voltage on a low potential side, has a desired voltage VREF. Voltage VH of node N6, which is output of OP1, is input of OP2. OP2 is a voltage follower circuit and outputs VH the same as output of OP1. In this way, since VH is generated while monitoring a monitor voltage associated with the bit line voltage, it is possible to improve accuracy. Furthermore, even if the threshold voltage VT of a MOS transistor changes due to a temperature change or the like, since VH also changes in correspondence with the change, it is possible to stably retain the data during the data retaining period. This circuit configuration generates VH such that a high potential side bit line voltage is VDD, and a low potential side bit line voltage is VREF, that is, the bit line voltage difference is VDD−VREF. For example, if VREF is 0.9V under the same conditions as FIG. 3, the bit line voltage difference is 0.1V, and VH at this time is −0.1V as described above. With configuration examples of other sense amplifiers also, in the same way an MBL configuration may be changed so as to obtain a desired characteristic. In this way, by setting the bit line voltage on the low potential side to VREF, it becomes possible to curb the leakage current as far as a limit that ensures a bit line potential difference that can be reproduced.

Various modifications can be made to the semiconductor device of the first exemplary embodiment of the present invention.

First Modified Example of the First Exemplary Embodiment

Figure 18:
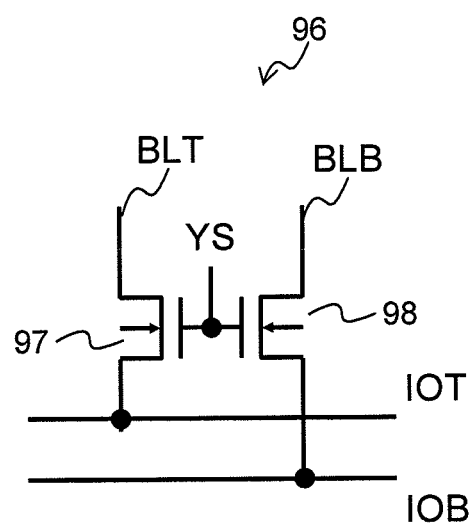
FIG. 18 is a circuit diagram of a Y selection switch of a first modified example of the first exemplary embodiment of the present invention.
Figure 19:
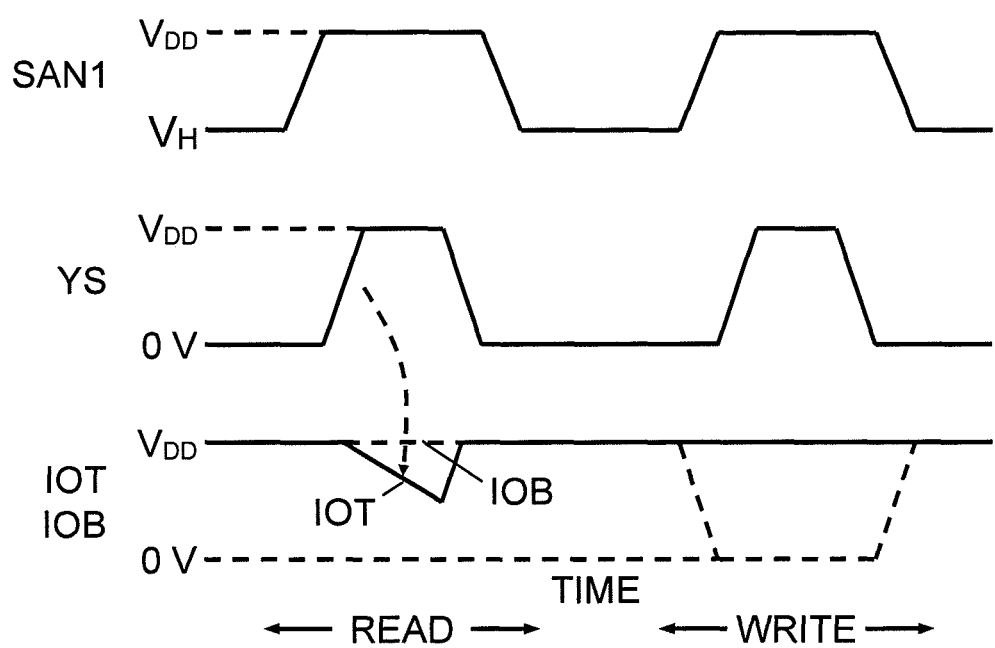
FIG. 19 is a control timing diagram of the Y selection switch of FIG. 18.
Figure 20:
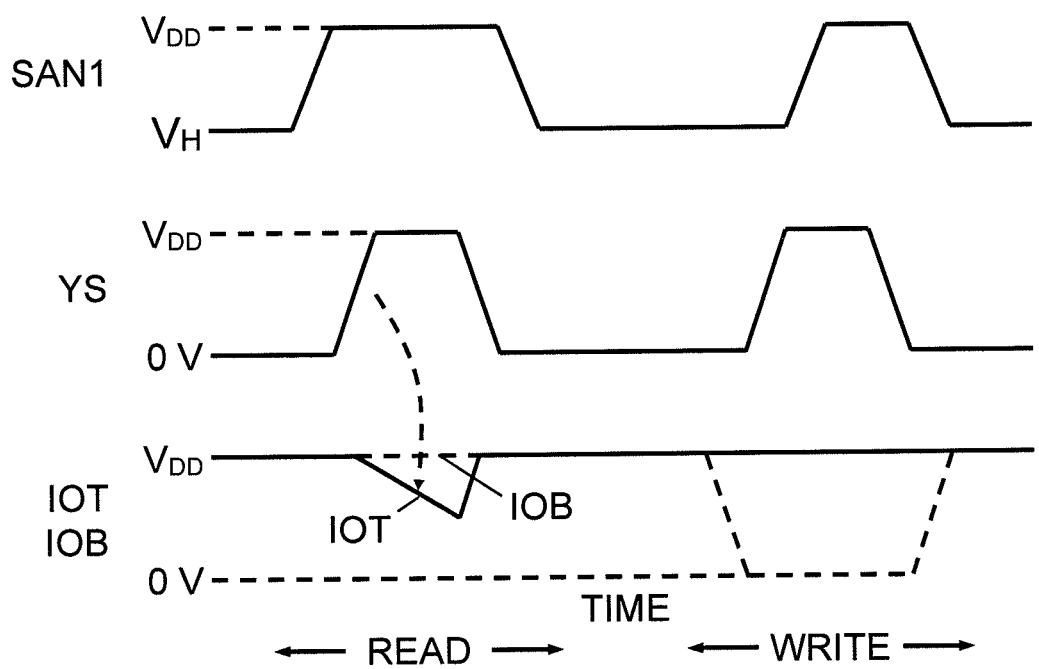
FIG. 20 is another control timing diagram of the Y selection switch of FIG. 18.

FIG. 18 is a circuit diagram of a Y selection switch YSW in a case of reading or writing data retained in the bit line pair BLT and BLB during a data retaining period, with respect to IOT and JOB, which are common I/O lines, with the first exemplary embodiment of FIG. 1 as an example. Furthermore, FIG. 19 and FIG. 20 are diagrams showing control timing relationships. In a case of reading, as in FIG. 19, if SAN1 is once again VDD, data is differentially extracted at high speed to the common I/O lines. In a case of writing, after applying a differential voltage of VDD to IOT and JOB, SAN1 and YS are controlled. As in FIG. 19, if control timing of SAN1 and YS is the same for a case of reading and a case of writing, the control circuit can be simplified. When writing, normally only in a period in which YS is activated, it is difficult to sufficiently discharge or to charge the potential of a storage node of a memory cell MC, so that it becomes necessary to apply a SAN1 pulse. If a drive current of a MOS transistor forming the sense amplifier SA is larger than a drive current of a MOS transistor forming the YSW, and information cannot be written, SAN1 may be once again made VDD after firstly driving YS as in FIG. 20.

Second Modified Example of the First Exemplary Embodiment

Figure 16:
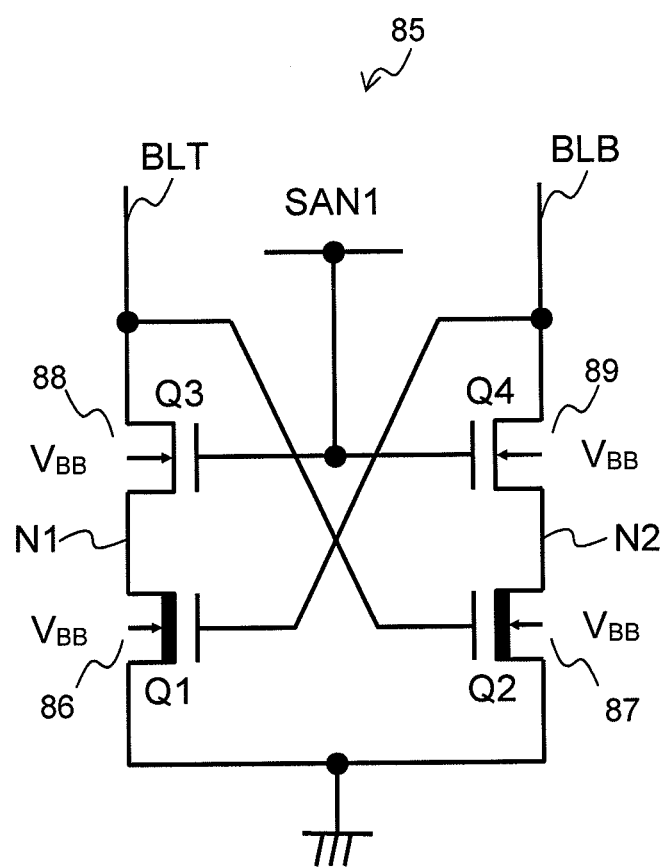
FIG. 16 is a circuit diagram of an NMOS sense amplifier of a second modified example of the first exemplary embodiment of the present invention.
Figure 27:
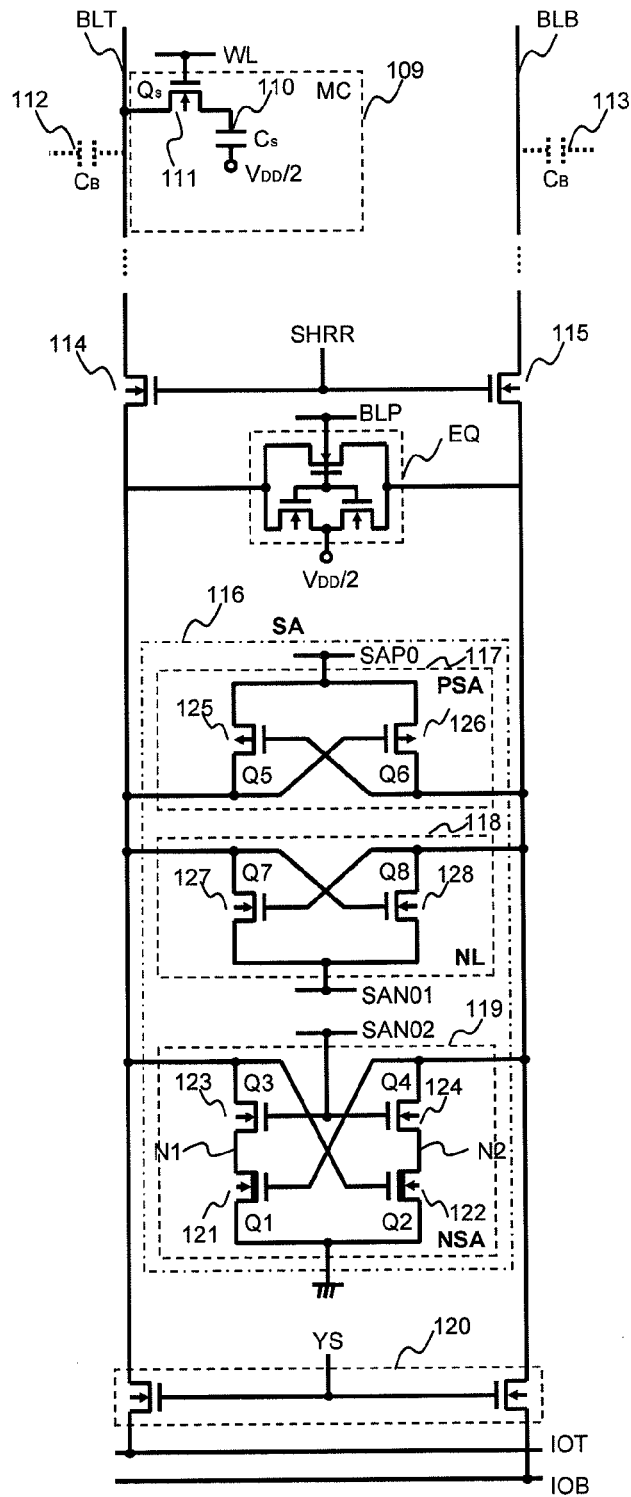
FIG. 27 is a diagram of a conventional sense amplifier and related circuit thereof.

FIG. 16 is another exemplary embodiment of the NMOS amplifier NSA and has a circuit configuration the same as the NSA 119 of the conventional technology of FIG. 27. In a second modified example of the first exemplary embodiment, the NSA 10 of FIG. 1 is replaced by a NSA 85 of FIG. 16, but otherwise has a configuration the same as FIG. 1. In the NSA 10 of FIG. 1, since the potential of nodes N1 and N2, at a time of sensing, is higher than ground voltage VSS by the drain-source voltages of Q3 and Q4 respectively, the gate-source voltages of Q1 and Q2 became lower by that voltage. On the other hand, in FIG. 16, since the sources of Q1 and Q2 are at ground voltage VSS, being 0V, the gate-source voltage of Q1 and Q2 is large compared to the NSA 10 of FIG. 1, so that it is possible to amplify at a higher speed than the sense amplifier of FIG. 1.

Third Modified Example of the First Exemplary Embodiment

Figure 21:
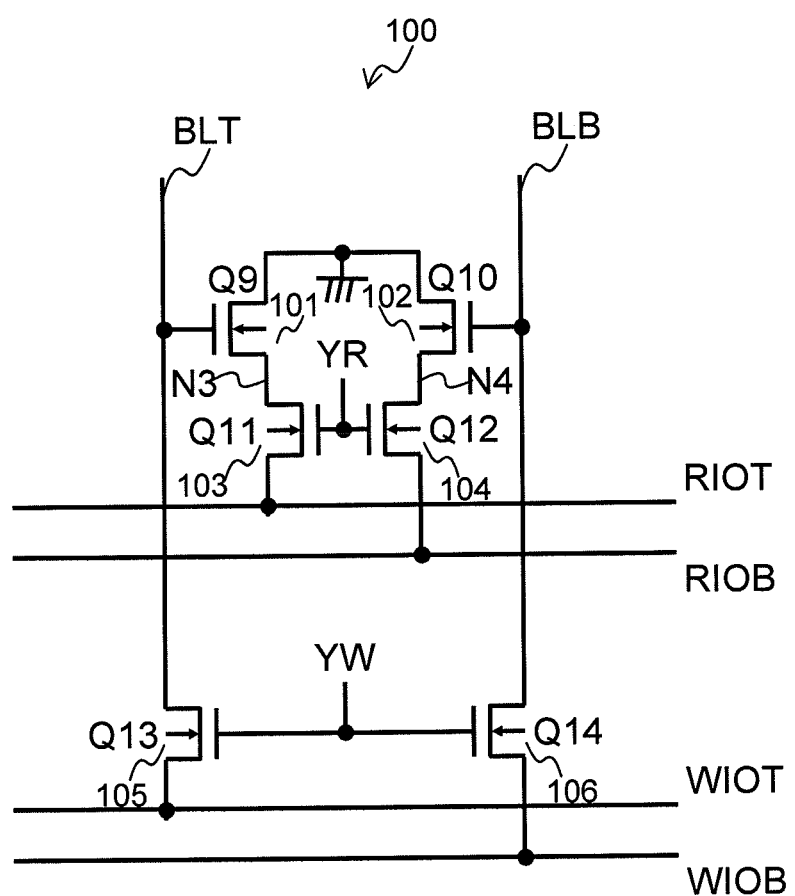
FIG. 21 is another circuit diagram of a Y selection switch of a third modified example of the first exemplary embodiment of the present invention.
Figure 22:
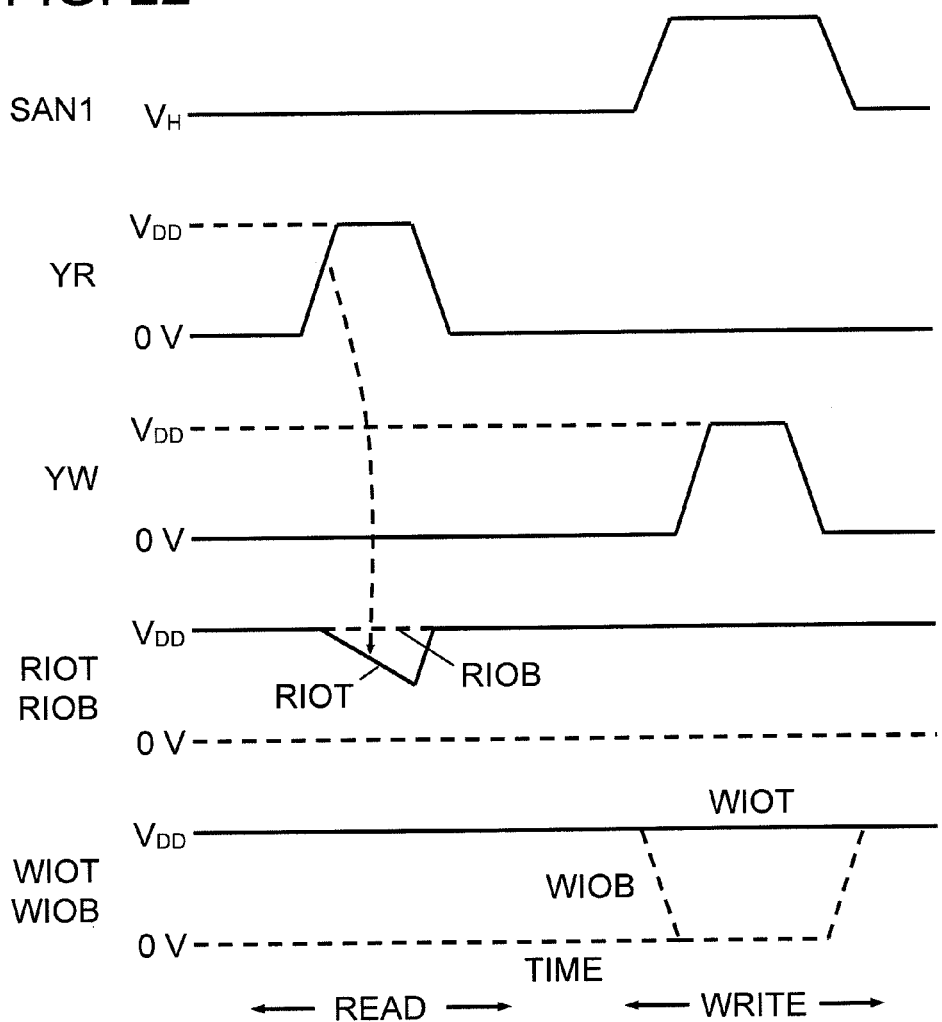
FIG. 22 is a control timing diagram of the Y selection switch of FIG. 21.

FIG. 21 is a circuit example using what is called a direct sensing scheme in which the bit line voltages BLT and BLB retained in the data lines are extracted directly to RIOT and RIOB, which are common I/O lines, via gates of the MOS transistors Q9 and Q10 in the Y selection switch YSW. An operation waveform thereof is shown in FIG. 22. By using the direct sensing scheme, since there is no longer a need to re-activate SAN1 when reading, it is possible to output data at high speed to RIOT and RIOB, which are common I/O lines. Writing is performed by reversing read information retained in the bit lines, via the MOS transistors Q13 and Q14 inside the YSW, and by replacing with writing information applied to WIOT and WIOB, which are common I/O lines. As in FIG. 21, by separating into RIOT and RIOB for reading the common I/O lines and WIOT and WIOB for writing, since load capacitance of the common I/O lines decreases, it is possible to output the read information at high speed to the common I/O lines, in comparison with a case where separation is not done.

Second Exemplary Embodiment

Figure 5:
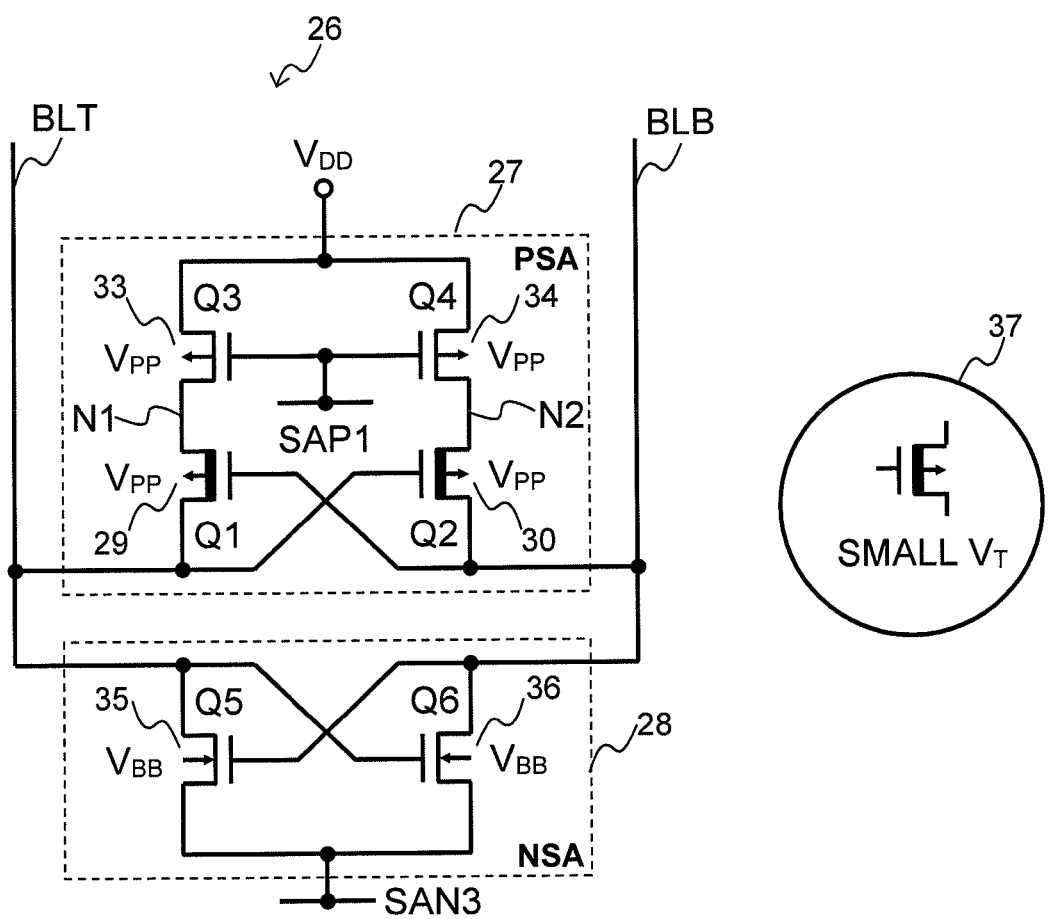
FIG. 5 is a circuit diagram of a sense amplifier of a second exemplary embodiment of the present invention.
Figure 6:
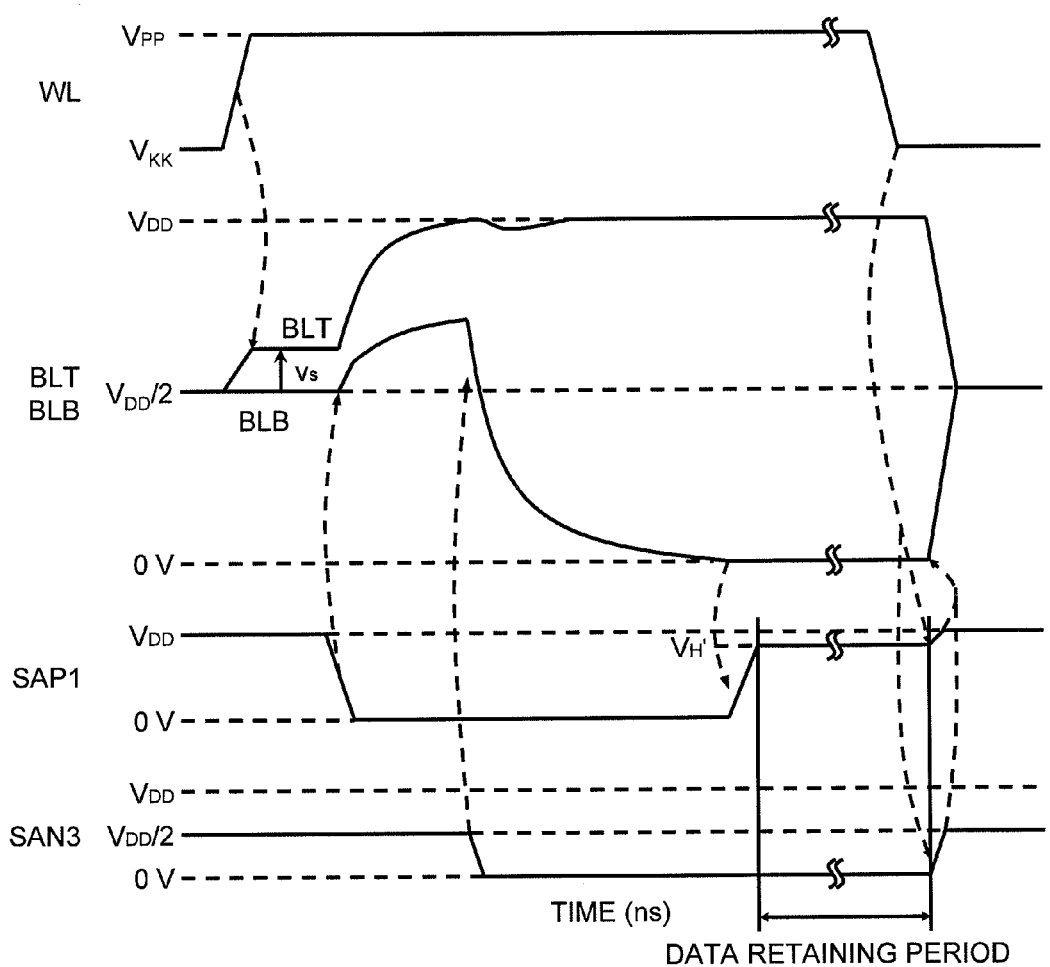
FIG. 6 is an operation timing diagram of the sense amplifier of FIG. 5.

In a configuration of a second exemplary embodiment, a sense amplifier of FIG. 1 is replaced by a sense amplifier SA 26 of FIG. 5. In the sense amplifier SA 26 of FIG. 5, MOS transistors forming the sense amplifier SA 8 of FIG. 1 are changed: from NMOS transistor to PMOS transistor, and from PMOS transistor to NMOS transistor. Therefore, with regard to MOS transistors and drive method, there is a complementary relationship with the exemplary embodiment of FIG. 1. A control circuit that generates a control voltage SAP1 and a control voltage SAN3 is disposed in control logic 32 of FIG. 24, and outputs a control voltage as shown in FIG. 6. An operation timing diagram for operation is shown in FIG. 6. If PSA 27 is driven, a signal Vs is amplified to a VDD side and thereafter an NSA 28 is turned ON, finally a voltage difference of a bit line pair BLT and BLB is amplified to VDD. In the second exemplary embodiment, by having a PMOS transistor, if the leakage current is smaller than that of a NMOS transistor, it is possible to effectively reduce the leakage current when retaining data.

Various modifications can be made to a semiconductor device of the second exemplary embodiment of the present invention.

Modified Example of the Second Exemplary Embodiment

Figure 17:
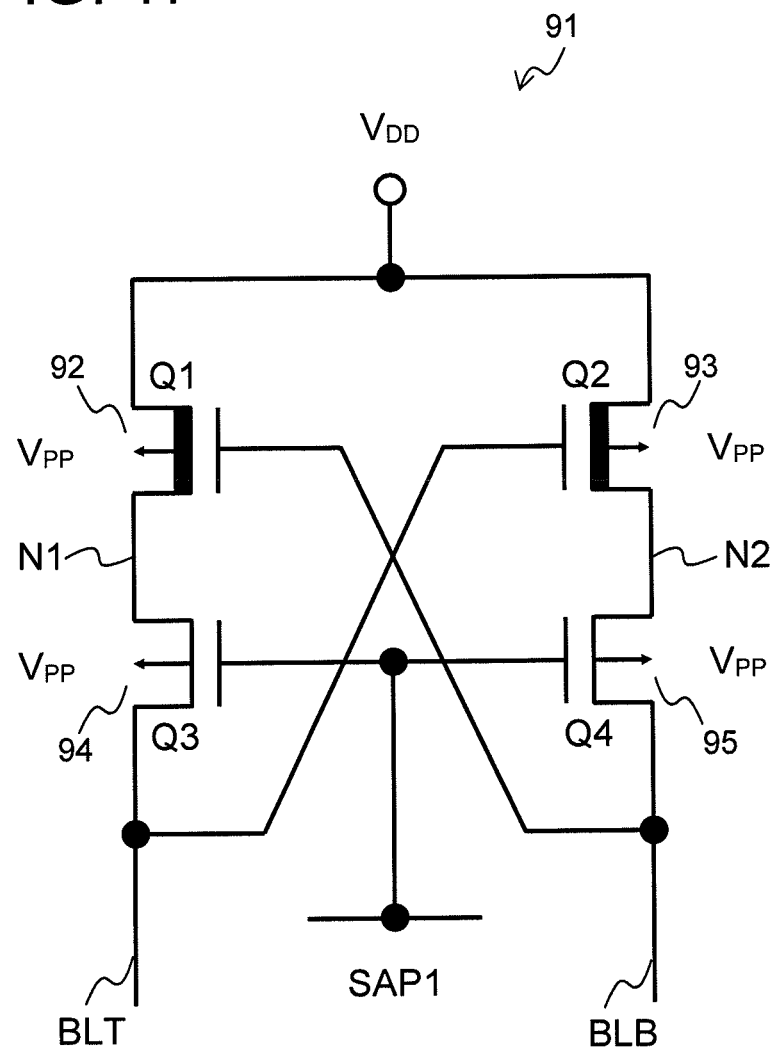
FIG. 17 is a circuit diagram of a PMOS sense amplifier of a modified example of the second exemplary embodiment of the present invention.

FIG. 17 is another exemplary embodiment of the PMOS amplifier PSA, in which NMOS transistors forming the NSA 85 of FIG. 16 are replaced by PMOS transistors. In addition, a control voltage SAN1 of FIG. 16 is changed to a control voltage SAP1 in FIG. 17. In a modified example of the second exemplary embodiment, with regard to FIG. 5, a PSA 27 of FIG. 5 is replaced by a PSA 91 of FIG. 17, but otherwise has a configuration the same as FIG. 5. An effect of the modified example of the second exemplary embodiment, similar to the second modified example of the first exemplary embodiment, is that an absolute value of the gate-source voltages of Q1 and Q2 is large, so that it is possible to amplify at a higher speed than a sense amplifier of FIG. 5. Furthermore, an operation timing diagram of the modified example of the second exemplary embodiment is the same as FIG. 6.

Third Exemplary Embodiment

Figure 7:
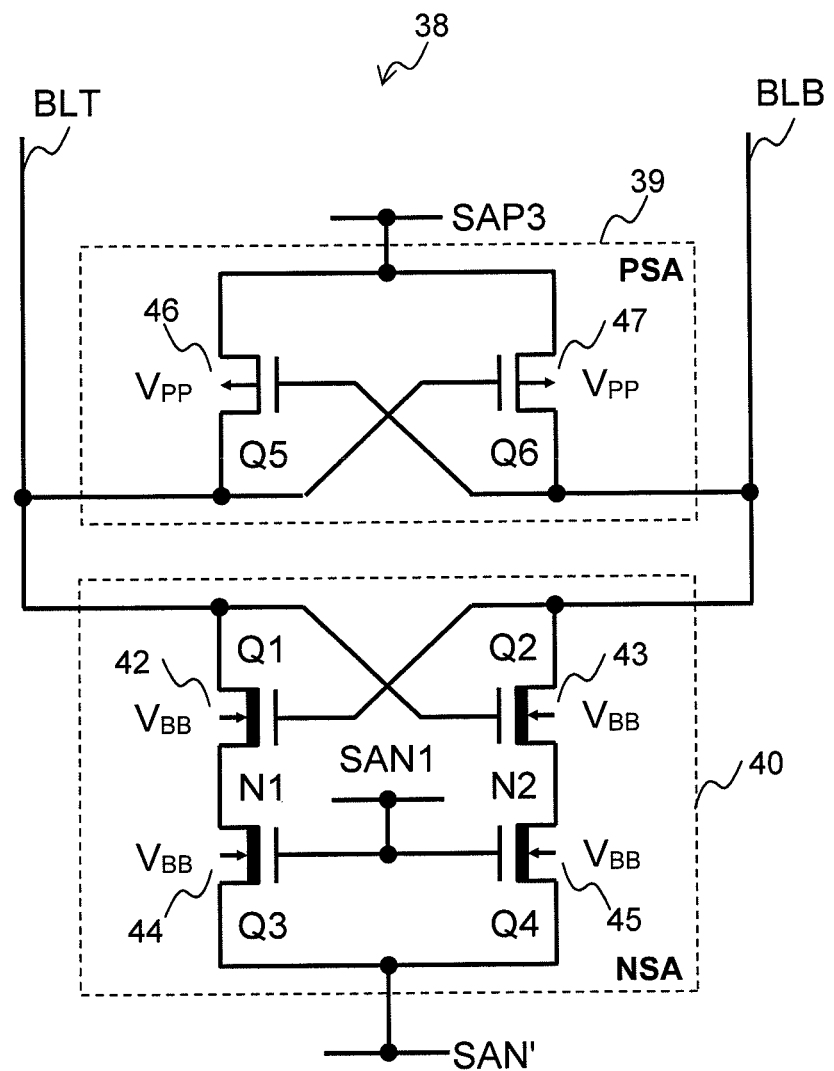
FIG. 7 is a circuit diagram of an NMOS sense amplifier of a third exemplary embodiment of the present invention.

In a configuration of a third exemplary embodiment, a sense amplifier SA 8 of FIG. 1 is replaced by a sense amplifier SA 38 of FIG. 7. In order to operate at a lower VDD, a threshold voltage VT of MOS transistors Q3 and Q4 has a low value. That is, all 4 MOS transistors forming a NSA 40 are transistors having lower absolute values than threshold voltages of transistors of peripheral circuit parts. A transistor of the peripheral parts is, for example, a MOS transistor used in a pre-charge circuit EQ (See FIG. 1), a MOS transistor 97 or 98, used internally in a Y selection switch YSW (See FIG. 18), a MOS transistor 6 or 7, turned ON or OFF by a control voltage SHRR (See FIG. 1), or the like. Furthermore, sources of Q3 and Q4 are commonly connected. In a case of using this type of small threshold voltage VT, the MOS transistors of Q3 and Q4 must be turned off during an inactivated period of an NSA 40. In order to do this, a measure is necessary for setting the level of a gate voltage SAN1 or a source voltage SAN' thereof.

Figure 8:
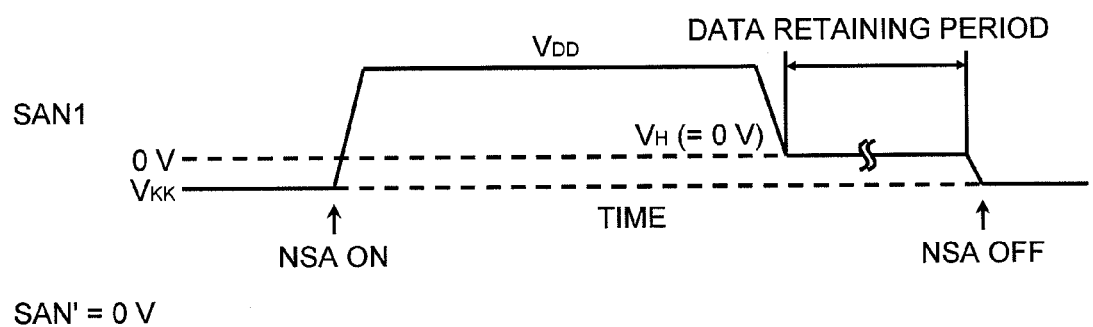
FIG. 8 is a control timing diagram of the NMOS amplifier of FIG. 7.

In FIG. 8, a voltage value of SAN1 in an inactivated period is set to VKK, which is a negative voltage, and a voltage value of SAN' is set to 0V. That is, SAN' is a ground power supply. When active, in order that Q3 and Q4 are ON, SAN1 is set to an appropriate positive voltage VDD. During a data retaining period, in order to reduce leakage current of a sense amplifier SA, SAN1 is lowered to a suitable value VH. Here, there is an advantage in that if VH is set to 0V, since a special power supply voltage is unnecessary, design is more easily carried out, and also the cost is lower. A control circuit that generates a control voltage SAN1 and a control voltage SAP3 is disposed in the control logic 32 of FIG. 24, and outputs a control voltage as shown in FIG. 8.

Various modifications can be made to a semiconductor device of the third exemplary embodiment of the present invention.

Modified Example of the Third Exemplary Embodiment

Figure 26:
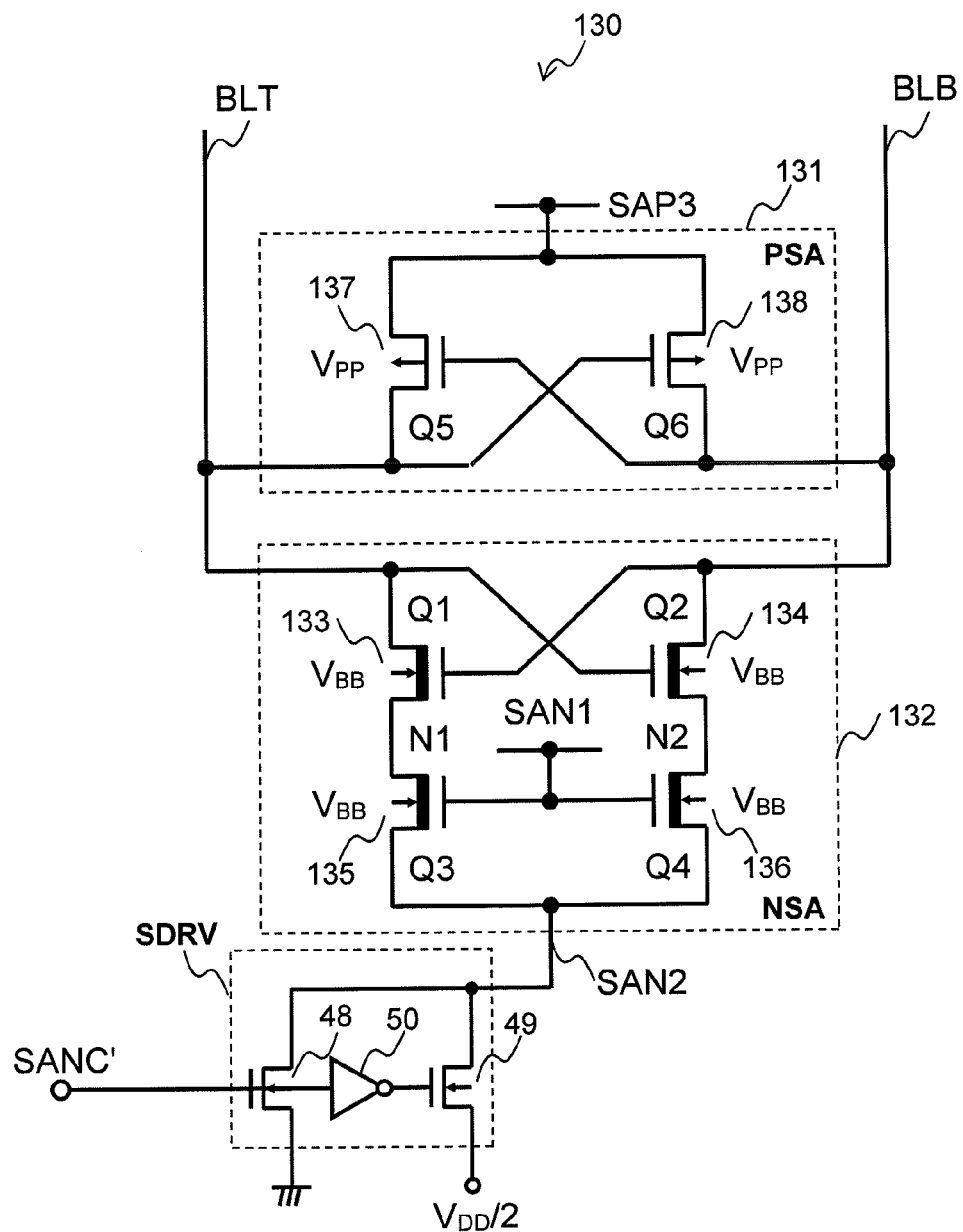
FIG. 26 is a circuit diagram of a sense amplifier of a modified example of the third exemplary embodiment of the present invention.

A modified example of the third exemplary embodiment, as shown in FIG. 26, has a configuration in which a control circuit SDRV supplying a control voltage SAN2 is added to FIG. 7. The control circuit SDRV is disposed in control logic 32 of FIG. 24. The SDRV is configured from 2 NMOS transistors and one inverter. The SDRV is controlled by a control signal SANC' outputted from the control logic 32 of FIG. 24. The control logic 32 is controlled by a control signal ICMD outputted from a command decoder 31. The command decoder 31 generates ICMD according to a command signal received from outside.

Figure 9:
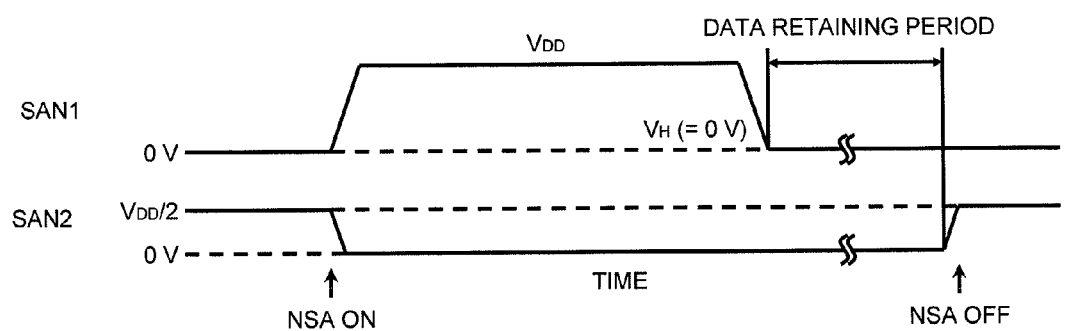
FIG. 9 is another control timing diagram of an NMOS amplifier of FIG. 26.

Next, a description is given of operation of a modified example of the third exemplary embodiment. In a standby state, SANC' is held at a Low level by the control logic 32, and SAN2 is held at VDD/2. In a case where an active command is inputted, until a pre-charge command is subsequently inputted, SANC' is driven and held at a High level by the control logic 32, and SAN2 is driven and held at ground voltage. In a case where a pre-charge command is inputted, SANC' is driven to a Low level by the control logic 32, and SAN2 is driven to VDD/2. In a case where a refresh command is inputted, SANC' is once driven to a High level by the control logic 32, and SAN2 is driven to ground voltage. Thereafter, after amplification and re-writing of memory cell data has ended, SANC' is driven once again to a Low level, and SAN2 is driven to VDD/2. FIG. 9 is a diagram for comparing operation of the modified example of the third exemplary embodiment with operation of the third exemplary embodiment shown in the abovementioned FIG. 8. In FIG. 9, a voltage value of SAN1 in an inactivated period is set to 0V, and a value of SAN2 is set to an appropriate positive voltage VDD/2. As a result, there is an advantage in that, since it is no longer necessary to set SAN1 to a negative voltage VKK as in FIG. 8, it is possible to simplify a circuit driving SAN1. Here, since the voltages of SAN1 and SAN2 during a data retaining period are 0V, and the threshold voltages VT of all MOS transistors inside a NSA are small, there is a considerable flow of a leakage current, but this is reduced by the stacking effect as described above. In addition, there is an advantage in that after timing at which the NSA 40 of the sense amplifier is turned OFF, the leakage current is completely cut. This is because, since SAN2 is returned to VDD/2, a sufficient reverse bias is added between gate and source of Q3 and Q4.

Figure 10:
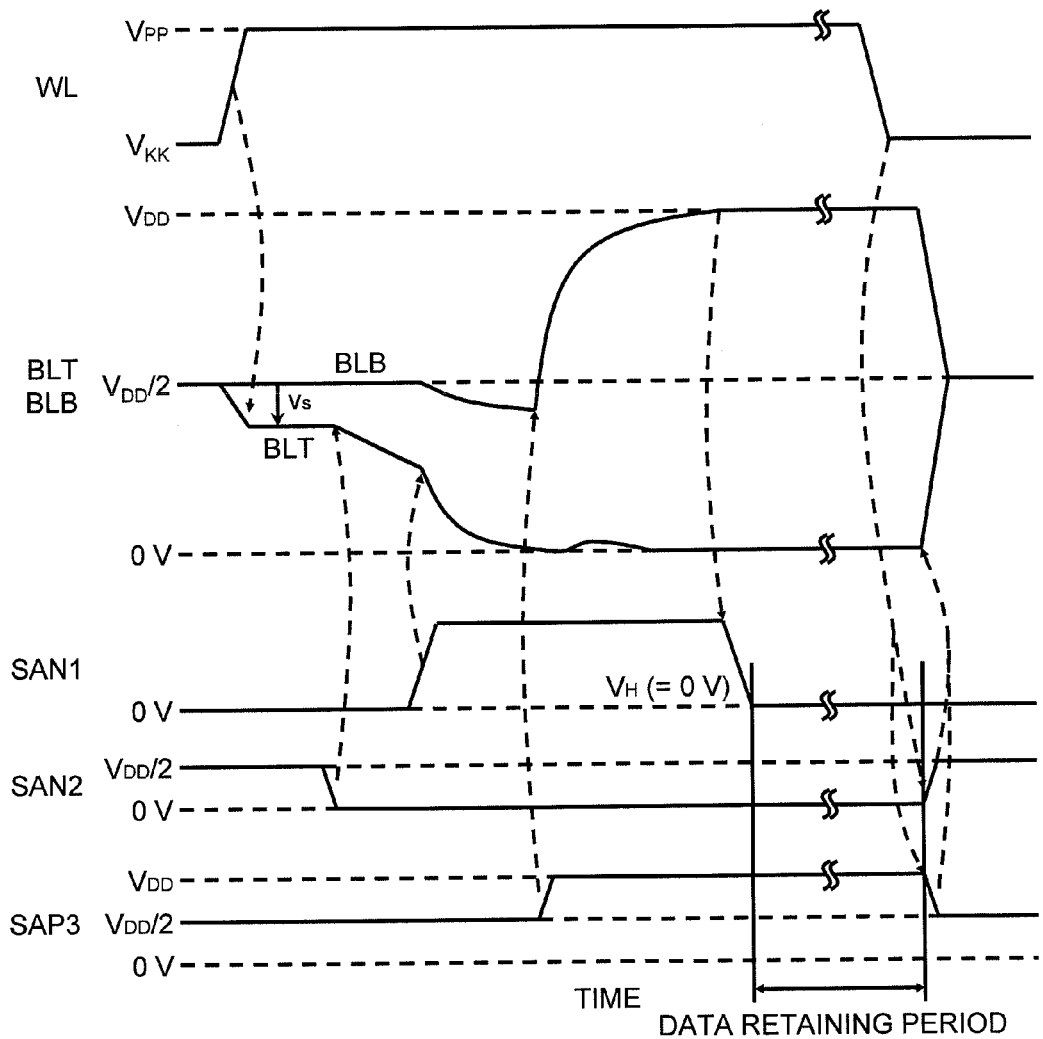
FIG. 10 is another control timing diagram of the NMOS amplifier of FIG. 26.

It is to be noted that in the example of FIG. 9, drive timing of SAN2 and SAN1 is made the same at a time of amplification, but as in FIG. 10, two stage amplification is also possible where SAN2 is made 0V, and thereafter SAN1 is at an appropriate positive voltage VDD. It is possible to curb noise due to capacitance imbalance between bit lines as described above. Furthermore, in this control process, since an amplification operation with VDD/2 and VDD only is possible, and there is no necessity to have SAN1 at VH, there is an advantage in that a circuit that generates VH is unnecessary, and the cost is low. Moreover, as shown in FIG. 10, a configuration is also possible where in addition to SAN2, SAP3 is changed.

Fourth Exemplary Embodiment

When a sense amplifier is operated at a VDD lower than 1.0V, for example, 0.5V, since a PMOS amplifier PSA 117, which has a large threshold voltage VT in a configuration of FIG. 27 of the conventional technology, no longer operates, an addition of a PMOS amplifier with a small threshold voltage VT, which has the reverse polarity of the NMOS amplifier NSA 119, is newly required. This sense amplifier requires 12 MOS transistors in total. As a result, a problem occurs in that, in order to operate the sense amplifier at a VDD of 0.5V, the area of the sense amplifier further increases.

Figure 11:
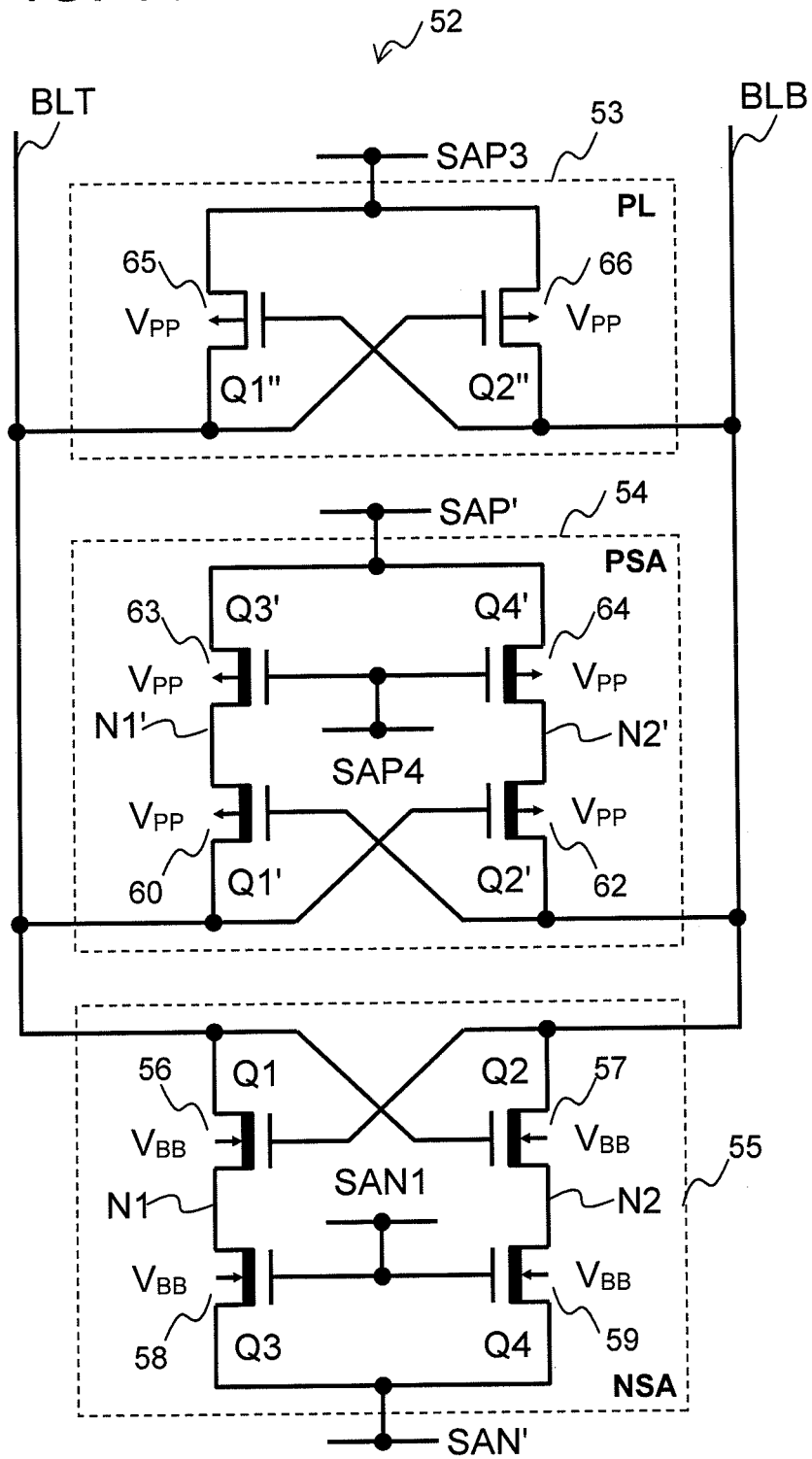
FIG. 11 is a circuit diagram of a sense amplifier of a fourth exemplary embodiment of the present invention.

The fourth exemplary embodiment has a configuration where a sense amplifier 8 in FIG. 1 is replaced by a sense amplifier 52 shown in FIG. 11, and the configuration has 10 MOS transistors, which is less than 12. The fourth exemplary embodiment, as described below, combines 0.5V operation and a low leakage current, with a sense amplifier SA 52 of FIG. 11. A control circuit, which generates a control voltage SAN1, a control voltage SAP3, and a control voltage SAP 4, is disposed in control logic 32 of FIG. 24.

The sense amplifier SA of FIG. 11 is configured from a sense amplifier in which a PSA 54 formed from PMOS transistors of small threshold voltage VT is added to a sense amplifier with a circuit configuration the same as FIG. 7. The number of MOS transistors is 10 in total. The control voltage SAP3 is set to VDD/2 when a PMOS latch PL 53 is in an inactive state, and to VDD when active. An amplification operation is performed by the PSA 54 and NSA 55 formed from MOS transistors all of which have a small threshold voltage VT, so that it is possible to amplify at high speed even at low voltage. During a data retaining period, the PSA 54 is made inactive, and the NSA 55 and PL 53 are used to retain data the same as the configuration of FIG. 1. Therefore, a leakage current characteristic at a time of retaining data is the same as FIG. 4.

Fifth Exemplary Embodiment

Figure 12:
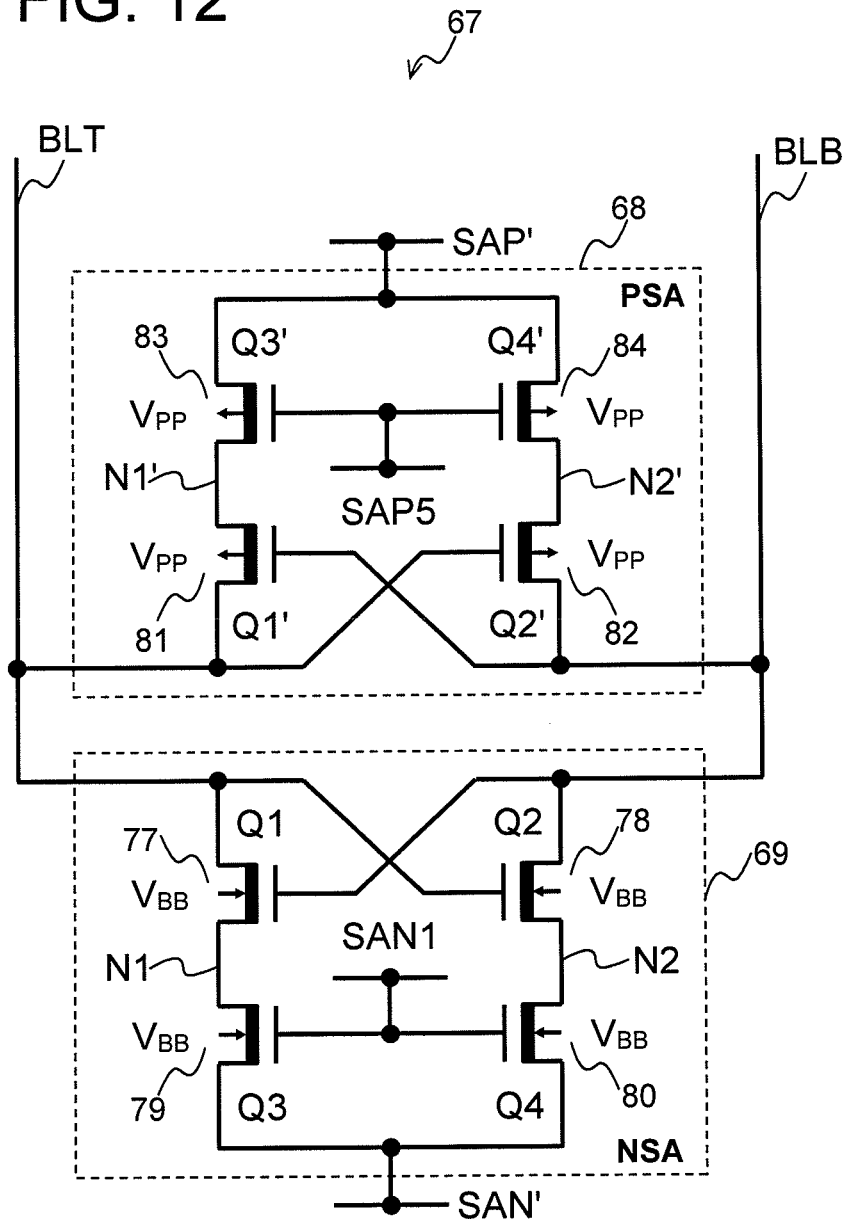
FIG. 12 is a circuit diagram of a sense amplifier of a fifth exemplary embodiment of the present invention.

A fifth exemplary embodiment has a configuration where a sense amplifier 8 in FIG. 1 is replaced by a sense amplifier SA 67 shown in FIG. 12. The sense amplifier SA 67 shown in FIG. 12 is formed of an NSA and PSA of a similar circuit configuration. Threshold voltages VT of all MOS transistors of the sense amplifier SA 67 are distinguished by being smaller than a threshold voltage VT of a MOS transistor forming a circuit that controls a sense amplifier. Therefore, VDD can be made low. Furthermore, since the number of MOS transistors is 8 in total, it is possible to reduce the sense amplifier area in comparison to the fourth exemplary embodiment. A control circuit, which generates a control voltage SAN1 and a control voltage SAP 5, is disposed in control logic 32 of FIG. 24.

Figure 13:
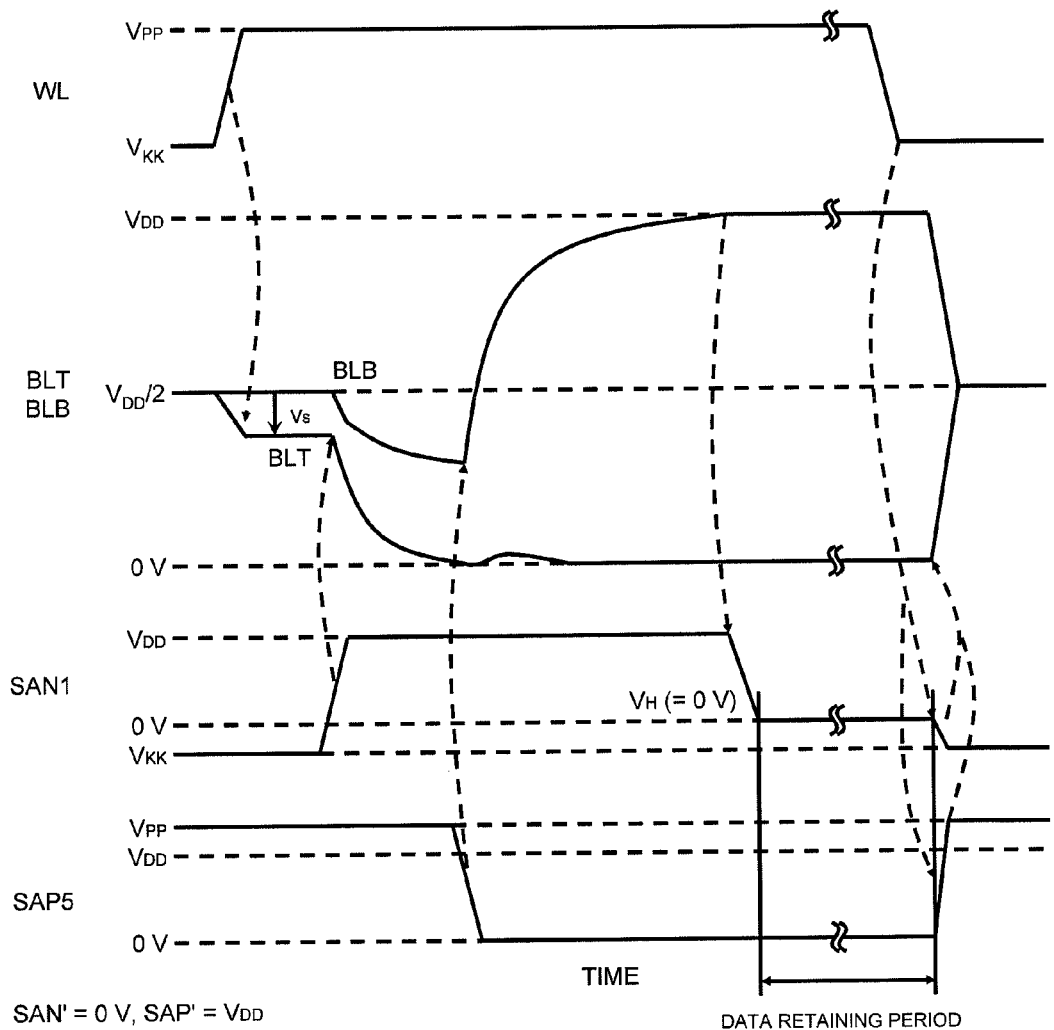
FIG. 13 is an operation timing diagram of the sense amplifier of FIG. 12.

An operation timing diagram is shown in FIG. 13. With regard to SAN1 a voltage shown in FIG. 8 is applied, with regard to SAPS a voltage that changes to 0V from a voltage VPP, which is higher than VDD, is applied, and furthermore, a common source SAN' is set to 0V, and a common source SAP' is set to VDD. Clearly, when inactive, since a reverse bias is applied between gate and source, with regard to Q3 and Q4, and Q3' and Q4', a leakage current does not flow in NSA 69 and PSA 68. An amplification operation as far as VDD in a first period is similar to what has been described heretofore. During a data retaining period, as described above, in order to reduce leakage current, SAN1 is lowered to an appropriate value VH.

Figure 14:
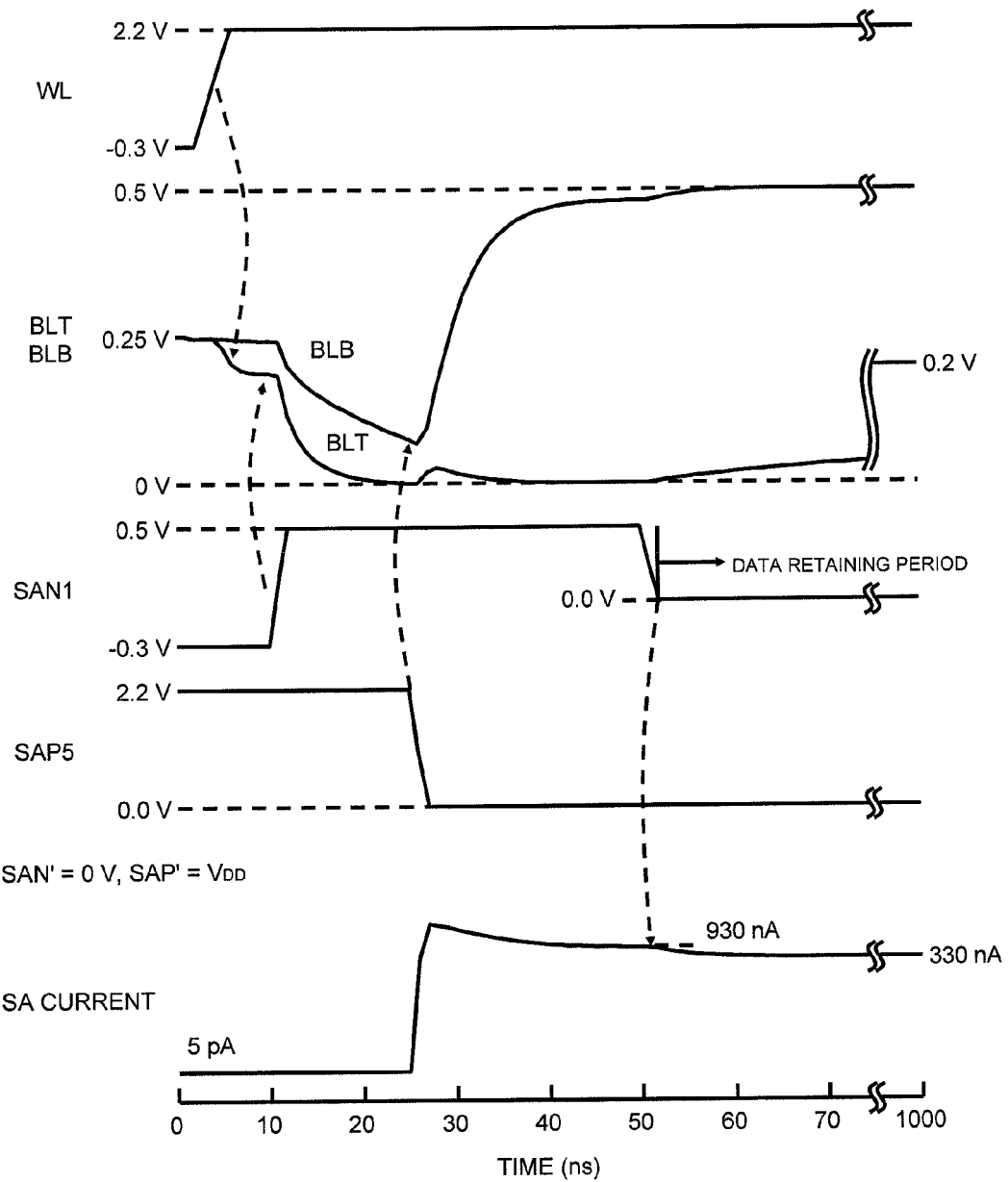
FIG. 14 is a simulation operation waveform diagram of the sense amplifier of FIG. 12.

FIG. 14 shows an actual simulation operation waveform when VDD=0.5V. VT is small, as in VT(Q1–Q4)=0.16V and VT(Q1'–Q4')=−0.14V, and device dimensions of an MOS transistor are: W/L(Q3, Q4)=0.46 μm/0.17 μm, W/L(Q1', Q2')=0.64 μm/0.14 μm, and W/L(Q3', Q4')=0.46 μm/0.14 μm. Other parameters are the same as in FIG. 3.

Figure 15A:
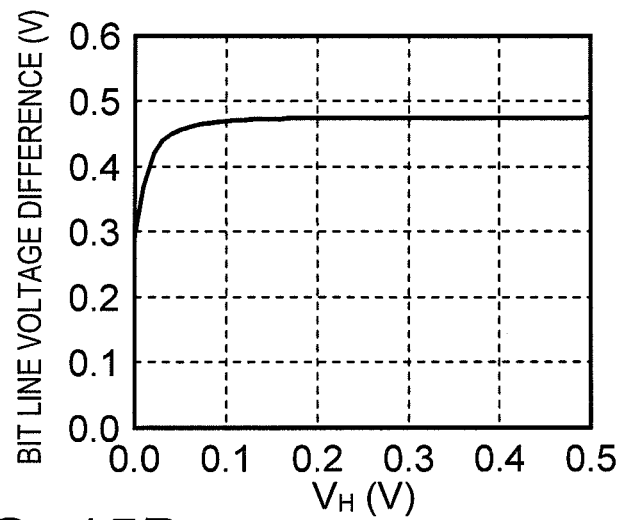
FIG. 15A is a diagram showing a relationship between bit line voltage difference and VH for the sense amplifier of FIG. 12.
Figure 15B:
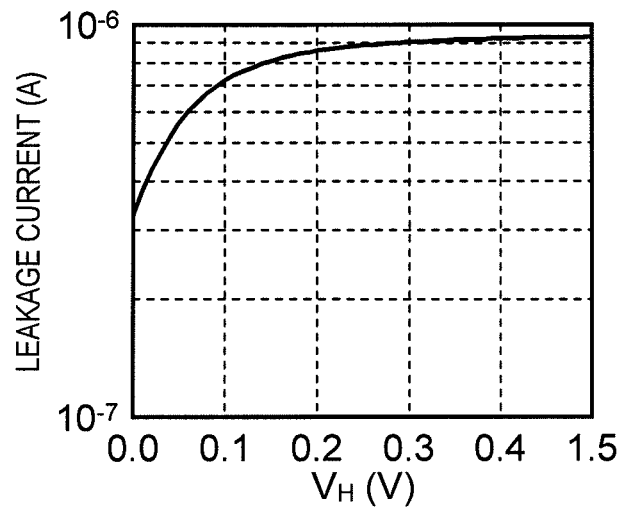
FIG. 15B is a diagram showing a relationship between leakage current and VH, when retaining data, for the sense amplifier of FIG. 12.

From FIG. 14, it is understood that even when VDD is 0.5V, amplification is performed at high speed to a level of VDD. When a data retaining period starts, the level of a bit line BLT at a low level side gradually rises, and eventually reaches 0.2V and stops. Since the voltage level of another bit line BLB is maintained at 0.5V, bit line voltage difference is maintained at 0.3V. FIG. 15A shows the bit line voltage difference versus VH, and FIG. 15B shows leakage current versus VH. The leakage current of the sense amplifier of the fifth exemplary embodiment is larger than for the sense amplifier shown in the fourth exemplary embodiment. However, in a case where pulse width of a word line voltage is sufficiently short, a period in which this leakage current flows is short and the effective leakage current is small, so that there is no problem. Even when long, that is, when data amplified on the bit lines is retained for a long time, by having VH=0V, for example, it is possible to reduce the leakage current to approximately ⅓.

It is to be noted that the BLT level gradually rises because the difference between the value of current flowing in Q1 and Q3 and the value of current flowing in Q1' and Q3' is reduced by driving SAN1 at VH. In a case where SAN1 is driven at VDD, and SAP 5 is driven at 0V, Q1, Q3, and Q3' are in an ON state, and Q1' is in an OFF state. As a result, since the current flowing in Q1 and Q3 is adequately larger than the value of the current flowing in Q1' and Q3', BLT is fixed at 0V. On the other hand, in a case where SAN1 is driven to VH, current drive capability of Q3 decreases in comparison to a case where SAN1 is driven to VDD. In this case, the current flowing in Q3 is a sub-threshold current. As a result, since the difference between the value of the current flowing in Q1 and Q3 and the value of the current flowing in Q1' and Q3' becomes small, BLT rises to 0.2V at which the value of the current flowing in Q1 and Q3 and the value of the current flowing in Q1' and Q3' balance. In this way when the level of BLT is raised, if SAN1 is once again at VDD immediately before the data retaining period is ended, an adequate signal is written to a memory cell.

The present invention can be used in a sense amplifier of a semiconductor memory device.

It should be noted that other objects, features and aspects of the present invention will become apparent in the entire disclosure and that modifications may be done without departing the gist and scope of the present invention as disclosed herein and claimed as appended herewith.

Also it should be noted that any combination or selection of the disclosed and/or claimed elements, matters and/or items may fall under the modifications aforementioned.

What is claimed is:
1. A semiconductor device comprising:
a plurality of memory cells;
a pair of bit lines coupled to ones of said memory cells;
a sense amplifier circuit coupled to said pair of bit lines, said sense amplifier including:
a first transistor including a first control electrode coupled to one of bit lines of said pair of bit lines,
a second transistor including a second control electrode coupled to the other of said bit lines of said pair of bit lines,
a third transistor coupled in series to said first transistor, said third transistor including a third control electrode, and
a fourth transistor coupled in series to said second transistor, said fourth transistor including a fourth control electrode, and
a control circuit supplying a control voltage in common to said third and said fourth control electrodes of said third and fourth transistors of said sense amplifier;
wherein the control circuit, during a first period of time when said sense amplifier circuit amplifies a difference of potential levels between said bit lines of said pair of bit lines, controls said control voltage so that said third and fourth transistors provide a first current supply ability, and during a second period of time when said sense amplifier holds an amplified difference of potential levels between said bit lines of said pair of bit lines, controls said control voltage so that said third and fourth transistors are rendered conductive and provide a second current supply ability that is different from said first current supply ability.

2. The semiconductor device according to claim 1, wherein said second current supply ability is lower than said first current supply ability.

3. The semiconductor device according to claim 2, wherein threshold voltages of said first and second transistors are smaller in absolute value than threshold voltages of said third and fourth transistor.

4. The semiconductor device according to claim 1, wherein threshold voltages of said first, second, third, and fourth transistors are smaller in absolute value than a threshold voltage of a transistor of a surrounding circuit part.

5. The semiconductor device according to claim 1, wherein said third transistor of said sense amplifier further includes a first main electrode coupled to the first transistor and a second main electrode, said fourth transistor of said sense amplifier further includes a third main electrode coupled to said second transistor and a fourth main electrode, and said control circuit supplies, during a third period of time different from both of said first period of time and said second of time, said control voltage in common to said third control electrode of said third transistor and said fourth control electrode of said fourth transistor so that a voltage level of said second electrode of said third transistor is higher in absolute value than a voltage level of said third control electrode and a voltage level of said fourth electrode of said fourth transistor is higher in absolute value than a voltage level of said fourth control electrode.

6. The semiconductor device according to claim 1, further comprising:
   a Y selection switch circuit that reads said amplified difference maintained in said sense amplifier to a pair of I/O lines, or writes a difference of potential levels between I/O lines of said pair of I/O lines to said bit lines of said pair of bit lines; wherein
   after returning said control voltage of said control circuit to a potential of said first period of time, said Y selection switch circuit is rendered conductive, and said amplified difference maintained in said sense amplifier is read to said pair of I/O lines; and
   writing is performed by giving potential corresponding to data to be written to said pair of I/O lines, and after returning said control voltage of said control circuit to a potential of said first period of time, rendering said Y selection switch circuit conductive, and giving said potential difference of said potential levels between said I/O lines of said pair of I/O lines to said bit lines of said pair of bit lines.

7. The semiconductor device according to claim 1, further comprising:
   a Y selection switch circuit that reads a potential difference maintained in said sense amplifier to a pair of I/O lines, or writes a difference of potential levels between I/O lines of said pair of I/O lines to said bit lines of said pair of bit lines; wherein
   after returning said control voltage of said control circuit to a potential of said first period of time, said Y selection switch circuit is made conductive, and said amplified difference maintained in said sense amplifier is read to said pair of I/O lines; and
   writing is performed by giving potential corresponding to data to be written to said pair of I/O lines, and after rendering said Y selection switch circuit conductive, returning a control voltage of said control circuit to a potential of said first period of time, and giving said difference of said potential levels between said I/O lines of said pair of I/O lines to said bit lines of said pair of bit lines.

8. The semiconductor device according to claim 1, further comprising:
   a pair of reading I/O lines;
   a pair of writing I/O lines;
   a reading Y selection switch circuit coupled to said pair of reading I/O lines, and
   a writing Y selection switch circuit coupled to said pair of writing I/O lines; wherein
   said reading Y selection switch circuit is rendered conductive and said amplified difference is read to said pair of reading I/O lines,
   writing is performed by giving potential corresponding to data to be written to said pair of writing I/O lines, and after returning said control voltage of said control circuit to a potential of said first period of time, rendering said writing Y selection switch circuit conductive, and giving a difference of potential levels of writing I/O lines of said pair of writing I/O lines to said bit lines of said pair of bit lines.

9. A semiconductor device comprising:
   a plurality of memory cells;
   a bit line pair connected to plural related memory cells among said plurality of memory cells;
   a sense amplifier circuit connected to said bit line pair, said sense amplifier including:
   a first transistor having a control electrode connected to one of said bit line pair,
   a second transistor having a control electrode connected to another of said bit line pair,
   a third transistor connected in series with said first transistor,
   a fourth transistor connected in series with said second transistor, and
   a control circuit that supplies a control voltage to control electrodes of said third and fourth transistors;
   wherein said control circuit controls said control voltage of said control circuit so that said sense amplifier circuit amplifies a potential difference between said bit line pair, in a first period, and in a second period of maintaining said amplified potential difference between said bit line pair, controls a sub-threshold current of said third and fourth transistors by said control voltage of said control circuit, so that said potential difference between said bit line pair is greater than or equal to a reproducible potential difference.

10. The semiconductor device according to claim 9, wherein a threshold voltage of said first and said second transistors has a smaller absolute value than a threshold voltage of said third and fourth transistor.

11. The semiconductor device according to claim 9, wherein a threshold voltage of said first, second, third, and fourth transistors has a smaller absolute value than a threshold voltage of a transistor of a surrounding circuit part.

12. The semiconductor device according to claim 9, wherein said control circuit performs control so that a voltage between gate and source of said third and fourth transistors is reverse-biased outside of said first period and said second period.

13. The semiconductor device according to claim 9, further comprising:
   a Y selection switch circuit that reads a potential difference maintained in said bit line pair to a common I/O line pair, or writes a potential difference of a common I/O line pair to said bit line pair; wherein
   after returning said control voltage of said control circuit to a potential of said first period, said Y selection switch circuit is made conductive, and said potential difference of said bit line pair is read to said common I/O line pair; and
   writing is performed by giving a potential difference corresponding to data to be written to said common I/O line pair, and after returning said control voltage of said control circuit to a potential of said first period, making said Y selection switch circuit conductive, and giving said potential difference of said common I/O line pair to said bit line pair.

14. A device comprising:
first and second bit lines;
a power supply node; and
first and second transistors coupled in series between the first bit line and the power supply node, the first transistor including a first control electrode coupled to the second bit line;
the second transistor being rendered conductive so as to provide a first current supply ability during a first period of time when voltage levels of the first and second bit lines are changed, and being rendered conductive so as to provide a second current supply ability different from the first current supply ability in a second period of time when the voltage levels of the first and second bit lines are substantially constant, the second period of time following the first period of time.

15. The device as claimed in claim 14, wherein the second current supply ability is lower than the first current supply ability.

16. The device as claimed in claim 14, further comprising third and fourth transistors coupled in series between the second bit line and the power supply node, the third transistor including a first control electrode coupled to the first bit line, and wherein the fourth transistor is rendered conductive so as to provide a third current supply ability during the first period of time and is rendered conductive so as to provide a fourth current supply ability different from the third current supply ability during the second period of time.

17. The device as claimed in claim 16, wherein the fourth current supply ability is lower than the third current supply ability.

18. The device as claimed in claim 16, wherein the third current supply ability is substantially equal to the first current supply ability and the fourth current supply ability is substantially equal to the second current supply ability.

19. The device as claimed in claim 14, wherein the first transistor has a first threshold voltage that is smaller in absolute value than a second threshold voltage of the second transistor.

20. The device as claimed in claim 14, wherein the second transistor is rendered non-conductive during a third period of time followed by the first period of time.

* * * * *